United States Patent
Huang et al.

(10) Patent No.: US 8,976,852 B2
(45) Date of Patent: Mar. 10, 2015

(54) INTER SYMBOL INTERFERENCE REDUCTION BY APPLYING TURBO EQUALIZATION MODE

(75) Inventors: Jinliang Huang, Solna (SE); Tore Mikael André, Älvsjö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/118,127

(22) PCT Filed: May 19, 2011

(86) PCT No.: PCT/SE2011/050635
§ 371 (c)(1),
(2), (4) Date: Nov. 15, 2013

(87) PCT Pub. No.: WO2012/158083
PCT Pub. Date: Nov. 22, 2012

(65) Prior Publication Data
US 2014/0204991 A1      Jul. 24, 2014

(51) Int. Cl.
H03H 7/30        (2006.01)
H03H 7/40        (2006.01)
(Continued)

(52) U.S. Cl.
CPC .... *H04L 25/03057* (2013.01); *H04L 25/03171* (2013.01); *H04L 25/03955* (2013.01);
(Continued)

(58) Field of Classification Search
CPC .......... H04L 25/03057; H04L 25/03171; H04L 25/03955; H04L 1/0036; H04L 1/005; H04L 1/206; H04L 27/38; H04L 1/0055; H03M 13/2957; H03M 13/2975; H03M 13/3715; H03M 13/612; H03M 13/6331; H03M 13/6525; H03M 13/09
USPC ......... 375/224, 229, 232–233, 262, 265, 285, 375/340–341, 346, 348, 350; 714/746, 752, 714/786, 792, 795
See application file for complete search history.

(56) References Cited

U.S. PATENT DOCUMENTS 7,010,064 B2   3/2006  Penther
8,522,119 B2 *  8/2013  Dick et al. .................... 714/780
(Continued)

FOREIGN PATENT DOCUMENTS

EP       1 179 935 A1    2/2002
JP       2005-236364 A   9/2005

OTHER PUBLICATIONS

International Search Report, PCT Application No. PCT/SE2011/050635, Feb. 6, 2012.
(Continued)

*Primary Examiner* — Jean B Corrielus
(74) *Attorney, Agent, or Firm* — Myers Bigel Sibley & Sajovec, P.A.

(57) ABSTRACT

The present disclosure relates to a receiving node, and to a related method for determining when to apply a turbo equalization mode to compensate for Inter-Symbol Interference in a radio signal received over a radio channel from a transmitting node. The method comprises decoding the received radio signal into a decoded signal, determining a current error level in the decoded signal, predicting a turbo equalization gain based on instantaneous channel information of the radio channel and deciding whether to apply the turbo equalization mode depending on the predicted turbo equalization gain and the determined current error level in the decoded signal.

23 Claims, 12 Drawing Sheets

(51) Int. Cl.
- H03K 5/159 (2006.01)
- H04L 25/03 (2006.01)
- H03M 13/29 (2006.01)
- H03M 13/37 (2006.01)
- H03M 13/00 (2006.01)
- H04L 1/00 (2006.01)
- H04L 1/20 (2006.01)
- H04L 27/38 (2006.01)
- H03M 13/09 (2006.01)

(52) U.S. Cl.
CPC ...... *H03M13/2957* (2013.01); *H03M 13/2975* (2013.01); *H03M 13/3715* (2013.01); *H03M 13/612* (2013.01); *H03M 13/6331* (2013.01); *H03M 13/6525* (2013.01); *H04L 1/0036* (2013.01); *H04L 1/005* (2013.01); *H04L 1/206* (2013.01); *H04L 27/38* (2013.01); *H03M 13/09* (2013.01)
USPC ........... 375/229; 375/224; 375/285; 375/348; 714/746

(56) References Cited

U.S. PATENT DOCUMENTS

| | | | |
|---|---|---|---|
| 2005/0013348 A1* | 1/2005 | Visoz et al. | 375/148 |
| 2005/0128966 A1* | 6/2005 | Yee | 370/310 |
| 2007/0153943 A1 | 7/2007 | Nissila | |

OTHER PUBLICATIONS

Written Opinion of the International Searching Authority, PCT Application No. PCT/SE2011/050635, Feb. 6, 2012.

Berardinelli et al., "Improving SC-FDMA Performance by Turbo Equalization in UTRA LTE Uplink", *VTC Spring 2008—IEEE Vehicular Technology Conference*, May 11-14, 2008, pp. 2557-2561.

Cavalcanti de Sá Neto et al., "Switching Linear Turbo Equalizers with Three Vector of Coefficients", *IEEE 2006 International Telecommunications Symposium*, Sep. 3-6, 2006, pp. 506-511.

Kim et al., "A New Adaptive Turbo Equalizer With Soft Information Classification", *ICASSP '1010—IEEE International Conference on Acoustics, Speech, and Signal Processing*, Mar. 14-19, 2010, pp. 3206-3209.

Laot et al., "Low-Complexity MMSE Turbo Equalization: A Possible Solution for EDGE", *IEEE Transactions on Wireless Communications*, vol. 4 No. 3, May 2005, pp. 965-974.

Lee et al., "Switching LMS Linear Turbo Equalization", *ICASSP '04—IEEE International Conference on Acoustics, Speech, and Signal Processing*, vol. 4, May 17-21, 2004, pp. IV-641-IV-644.

Lee et al., Switching Methods for Linear Turbo Equalization, *ISCAS '04—Proceedings of the 2004 International Symposium on Circuits and Systems*, Vo. 3, May 23-26, 2004, pp. III-601-III-604.

Rohani et al., "Computation of Instantaneous Bit Error Probability from Log-Likelihood Ratio", *IEICE Technical Report*, vol. RCS2008-150, Nov. 2008, pp. 119-123.

Tüchler et al., "Turbo Equalization: Principles and New Results", *IEEE Transactions on Communications*, vol. 50, No. 5, May 2002, pp. 754-767.

* cited by examiner

INTER SYMBOL INTERFERENCE REDUCTION BY APPLYING TURBO EQUALIZATION MODE

CROSS REFERENCE TO RELATED APPLICATION

This application is a 35 U.S.C. §371 national stage application of PCT International Application No. PCT/SE2011/050635, filed on 19 May 2011, the disclosure and content of which is incorporated by reference herein in its entirety. The above-referenced PCT International Application was published in the English language as International Publication No. WO 2012/158083 A1 on 22 Nov. 2012.

TECHNICAL FIELD

The present disclosure relates generally to a method and an arrangement in a receiving node to compensate for Inter-Symbol Interference in a radio signal received over a radio channel from a transmitting node. In particular it relates to determining when to apply a turbo equalization mode to compensate for the Inter-Symbol Interference in the received radio signal.

BACKGROUND

The Universal Mobile Telecommunication System (UMTS) is one of the third generation mobile communication technologies designed to succeed the Global System for Mobile communication (GSM). 3GPP Long Term Evolution (LTE) is a project within the $3^{rd}$ Generation Partnership Project (3GPP) to improve the UMTS standard to cope with future requirements in terms of improved services such as higher data rates, improved efficiency, and lowered costs. The Universal Terrestrial Radio Access Network (UTRAN) is the radio access network of a UMTS and Evolved UTRAN (E-UTRAN) is the radio access network of an LTE system. In an E-UTRAN, a user equipment (UE) is wirelessly connected to a radio base station (RBS) commonly referred to as an eNodeB (eNB). The eNBs are directly connected to a core network (CN).

In a wireless communication system using Orthogonal Frequency Division Multiplexing (OFDM) technology, the entire channel is divided into many narrow sub-channels, which are transmitted in parallel. This technique thus transforms a frequency selective wide-band channel into a group of non-selective narrowband channels, making it robust against large delay spread by preserving the orthogonality in the frequency domain. The primary advantage of OFDM over single-carrier schemes is its ability to cope with severe channel conditions without complex equalization filters in the receiver. Channel equalization is simplified because OFDM may be viewed as using many slowly-modulated narrowband signals rather than one rapidly-modulated wideband signal. The low symbol rate makes the use of a guard interval between symbols affordable, making it possible to handle time-spreading and eliminate inter-symbol interference.

In an LTE system the OFDM technology is adopted as a mean to achieve high transmission capability and robustness to multi-path delay. Orthogonal Frequency Division Multiple Access (OFDMA) is used in the downlink, and Single-carrier Frequency Division Multiple Access (SC-FDMA) is used in the uplink. OFDMA is a multi-user version of OFDM, where multiple access is achieved by assigning subsets of sub-carriers to individual users. SC-FDMA is a linearly pre-coded OFDM scheme. The distinguishing feature of SC-FDMA is that it leads to a single-carrier transmit signal, in contrast to OFDMA which is a multi-carrier transmission scheme. Furthermore, SC-FDMA has a lower peak-to-average power ratio which entails improved transmitter power efficiency for the battery-operated UE.

In LTE downlink (DL), the physical layer is thus based on OFDMA. The information to be transmitted is coded e.g. by a turbo coding, interleaved, scrambled, and modulated to symbols. Some examples of modulation schemes are the Phase Shift Keying (PSK) modulations such as Quaternary or Quadrature PSK (QPSK), and the combinations of PSK and Amplitude Shift Keying (ASK) modulations such as 16 Quadrature Amplitude Modulation (QAM) and 64QAM. The symbols are fed to an Inverse Fast Fourier Transform (IFFT), where these symbols are mapped to a specified frequency interval specified as a number of sub-carriers. A resource block consists of 12 sub-carriers and is the smallest amount that a UE can be allocated. The IFFT is used to transform the symbols to be transmitted from a frequency domain representation to a time domain representation.

In LTE uplink (UL), the physical layer is based on SC-FDMA, which is also referred to as pre-coded OFDM. This means that the physical channels are built of SC-FDMA symbols. The modulated symbols are transformed to the frequency domain by a Discrete Fourier Transform (DFT) of the same size as the number of modulated symbols of each SC-FDMA symbol. This is then fed to a larger IFFT with a size which depends on the bandwidth of the radio communication link.

A radio communication between a UE and an RBS will be affected by multi-path propagation, fading, frequency errors, round trip times etc. This communication channel is often referred to as an air interface, and causes bit and block errors on information transmitted. A receiver is designed in order to reduce bit error and block error rates, and comprises e.g. FFTs, channel estimators, an equalizer and an antenna combining unit. In brief the LTE UL Layer 1 receiver chain consists of the following steps:

1. FFT to extract users, done per antenna
2. Channel estimation, done per antenna and user
3. Antenna Combination, combining signals from different antennas
4. Equalization using channel estimates
5. IFFT
6. Soft De-mapping, de-mapping symbols to soft values
7. Decoding In LTE the equalization is based on the channel estimation and the purpose of the equalization is to compensate for channel distortion. Different methods for equalization may be used depending on the characteristics of the channel distortion. The most common method is linear Minimum Mean Square Error (MMSE) equalization. However, an MMSE equalizer does not provide good performance when the channel distortion includes non-negligible inter-symbol-interference (ISI). Inter-symbol interference is a form of distortion of a signal in which one symbol interferes with subsequent symbols. This is an unwanted phenomenon as the previous symbols cause disturbances, thus making the communication less reliable.

To combat the impact of ISI in SC-FDMA transmitted signals and Enhanced General Packet Radio Service (EG-PRS) transmitted signals respectively, the articles Berardinelli, G., Priyanto, B. E., Sorensen, T. B., and Mogensen, P., "*Improving SC-FDMA Performance by Turbo Equalization in UTRA LTE Uplink*" Vehicular Technology Conference, 2008. VTC Spring 2008 and C. Laot, R. Le Bidan and D. Leroux, "*Low-complexity MMSE turbo equalization: A pos-* sible solution for EDGE," IEEE transactions on wireless communications, vol. 4, No. 3, pp. 965-974, May 2005. IEEE, pp. 2557-2561, May 2008 propose using turbo equalization methods. According to these a turbo equalizer that involves a combination of decoding and equalization is used to deal with the ISI in the received radio signals. The idea of such a turbo equalizer is to make use of soft values that are output from the decoder, to improve the result of the equalizer so that ISI is significantly reduced in the signal to be decoded.

However, this algorithm involves iteratively re-modulating the soft bits or soft values of coded bits into symbols and feeding them back into the receiver chain from equalizer to decoder, which means high computational complexity and requires a lot of computational power of the Digital Signal Processor (DSP). Several iterations are needed in order to get acceptable performance gain in terms of increased throughput. There is however no guarantee that the turbo equalizer, or the turbo equalization mode of an equalizer capable of operation in more than one equalization mode, provides an acceptable gain if employed. Utilization of the turbo equalizer may therefore be prevented, as disclosed in U.S. Pat. No. 7,010,064 B2 to Penther, where the receiver switches between a branch for turbo equalization and a branch for equalization and turbo decoding depending on delay spread of the transmission channel. A switch in the receiver is controlled by an estimator which estimates the delay spread and compares it with a predetermined threshold. If the delay spread is above the threshold turbo equalization is selected. If the delay spread is below the threshold equalization by a soft-equalizer followed by decoding by a turbo decoder is selected. Thus, in U.S. Pat. No. 7,010,064 B2 channel delay spread is used as a criterion to determine if it is necessary to switch on or employ the turbo equalizer. Nevertheless, this measure does not solve the problem as the gain in throughput may vary even with the same channel delay spread. Additionally, in a realistic situation when only a limited number of iterations can be afforded, it is likely that the turbo equalizer could not guarantee error-free decoding or an acceptable gain in terms of throughput even if it is theoretically beneficial to switch it on.

SUMMARY

It is therefore a first object of at least some of the embodiments of the present disclosure to provide for a better yield in terms of increased throughput when employing a turbo equalizer or turbo equalization mode in a receiver chain for decoding a received radio signal.

A second object according to some of the embodiments is to provide for a reduced computational complexity and consumption of computational power in one or more DSPs of a receiver chain for decoding a received radio signal in a radio receiver.

A third object according to some of the embodiments is to enable more accurate determination of when to apply a turbo equalization mode in a receiving node to compensate for Inter-Symbol Interference (ISI) in a radio signal received over a radio channel from a transmitting node.

These objects and others are achieved by the method and node according to the independent claims, and by the embodiments according to the dependent claims.

In accordance with one embodiment of the present disclosure, a method in a receiving node for determining when to apply a turbo equalization mode to compensate for ISI in a radio signal received over a radio channel from a transmitting node is provided. According to the method, the receiving node decodes the received radio signal into a decoded signal and determines a current error level in the decoded signal. The receiving node then predicts a turbo equalization gain based on instantaneous channel information of the radio channel. Finally, the receiving node decides whether to apply the turbo equalization mode depending on the predicted turbo equalization gain and the determined current error level in the decoded signal.

In accordance with another embodiment, a receiving node configured to receive a radio signal over a radio channel from a transmitting node is provided. The receiving node comprises a turbo equalizer configured to decode the received radio signal and to selectively operate in a turbo equalization mode to compensate for ISI in the received radio signal. The receiving node further comprises an equalization mode selector that is operatively connected to the turbo equalizer and a channel estimator that is operatively connected to the turbo equalizer and to the equalization mode selector. The equalization mode selector is configured to determine a current error level in the decoded signal and to predict a turbo equalization gain based on instantaneous channel information. Further, the equalization mode selector is configured to decide whether to apply the turbo equalization mode depending on the predicted turbo equalization gain and the determined current error level in the decoded signal. The channel estimator is configured to provide said instantaneous channel information.

Since the receiving node decides whether to apply the turbo equalization mode depending on the predicted turbo equalization gain and the current error level in the decoded signal, more accurate determination of when to apply a turbo equalization mode to compensate for Inter-Symbol Interference (ISI) in the received radio signal is enabled. Thereby the computational complexity and consumption of computational power in one or more DSPs of the receiver chain for decoding the received radio signal is reduced, as the turbo equalization mode will not be used when it is not needed or not possible to improve the result of the decoding, i e the decoded signal that is output from the decoder. Further, the yield in terms of increased throughput when employing the turbo equalizer or turbo equalization mode will increase when it is used when there is a potential for improving the decoded signal that is output from the decoder so that re-transmissions can be avoided, but not when the final result of the decoding will anyhow be that a re-transmission is needed.

A further advantage is that the reduced computational complexity and consumption of computational power in DSPs can be exploited in terms of increased capacity, i e capability to handle more users, or in terms of more relaxed or less demanding dimensioning requirements, e g less hardware, in the receiving node.

DETAILED DESCRIPTION

In the following, different aspects will be described in more detail with references to certain embodiments and to accompanying drawings. For purposes of explanation and not limitation, specific details are set forth, such as particular scenarios and techniques, in order to provide a thorough understanding of the different embodiments. However, other embodiments that depart from these specific details may also exist.

Moreover, those skilled in the art will appreciate that while the embodiments are primarily described in form of a method and a node, they may also be embodied in a computer program product as well as in a system comprising a computer processor and a memory coupled to the processor, wherein the memory is encoded with one or more programs that may perform the method steps disclosed herein, as described below with reference to FIG. 9*b*.

Embodiments are described herein by way of reference to particular example scenarios. Particular aspects are described in a non-limiting general context in relation to an LTE system. It should though be noted that the invention and its example embodiments may also be applied to other types of radio access networks using turbo equalization. Further, although embodiments of this disclosure are set out in a Single-Input-Multiple-Output (SIMO) context, using one transmit antenna and two receive antennas, the principles of this disclosure are also applicable to systems and nodes using for example a single receive antenna or more than two receive antennas. Further, the teachings of this disclosure can be extended to multiple transmit antennas. For example it is conceivable to apply these teachings to MIMO using diversity schemes and spatial multiplexing schemes.

Figure 1:
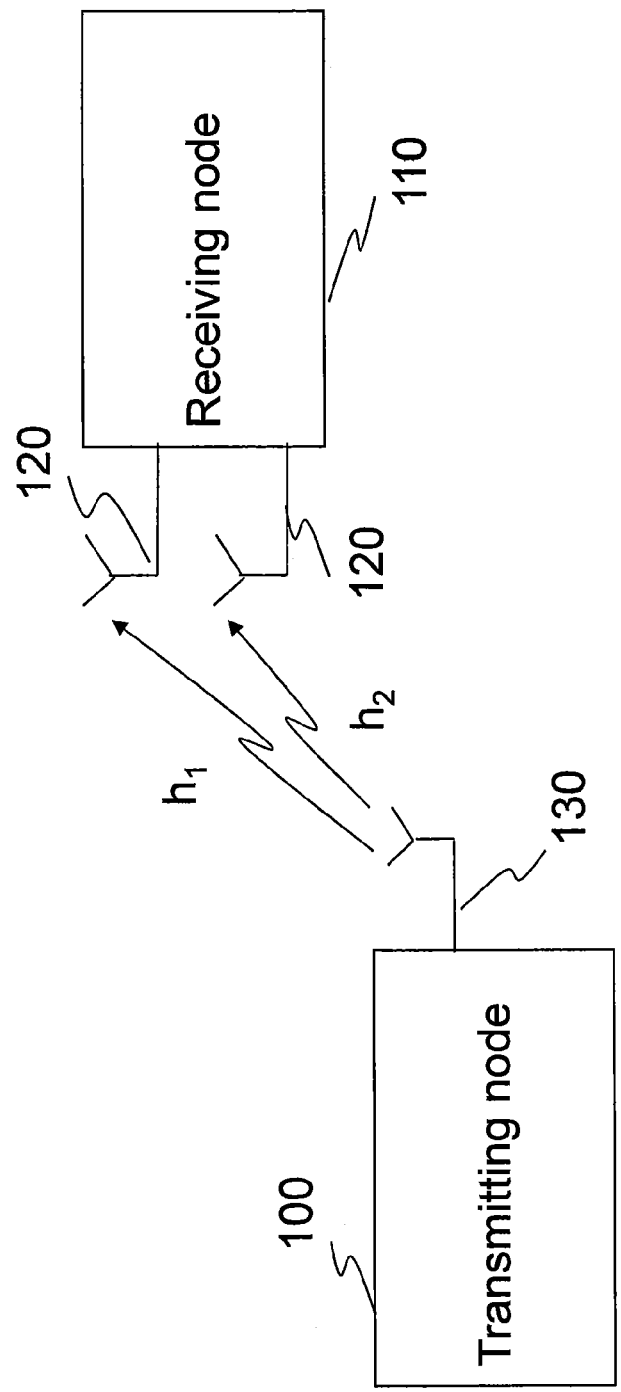
FIG. 1 is a schematic block diagram illustrating communication over a radio channel between a transmitting node and a receiving node.

Accordingly, FIG. 1 illustrates a context where equalization of radio signals that may be subject to ISI according to embodiments of this disclosure may be applied. In FIG. 1 a transmitting node 100 transmits a radio signal via transmit antenna 130 over a radio channel $h_1$, $h_2$ to a receiving node 110. Receiving node 110 receives the radio signal via one or more receive antennas 120. The transmitting node may be a wireless terminal, such as a mobile terminal or User Equipment in an LTE system. It may also be a laptop or other device adapted for transmitting radio signals in a wireless communication system such as the LTE system. The receiving node may be a radio base station (RBS), such as an evolved NodeB (eNB) in the LTE system. It may also be a relay node (RN) configured for relaying signals between the wireless terminal and a network node, e g an RBS or eNB, or other equipment or node adapted for receiving radio signals in a wireless communication system such as the LTE system.

Figure 2:
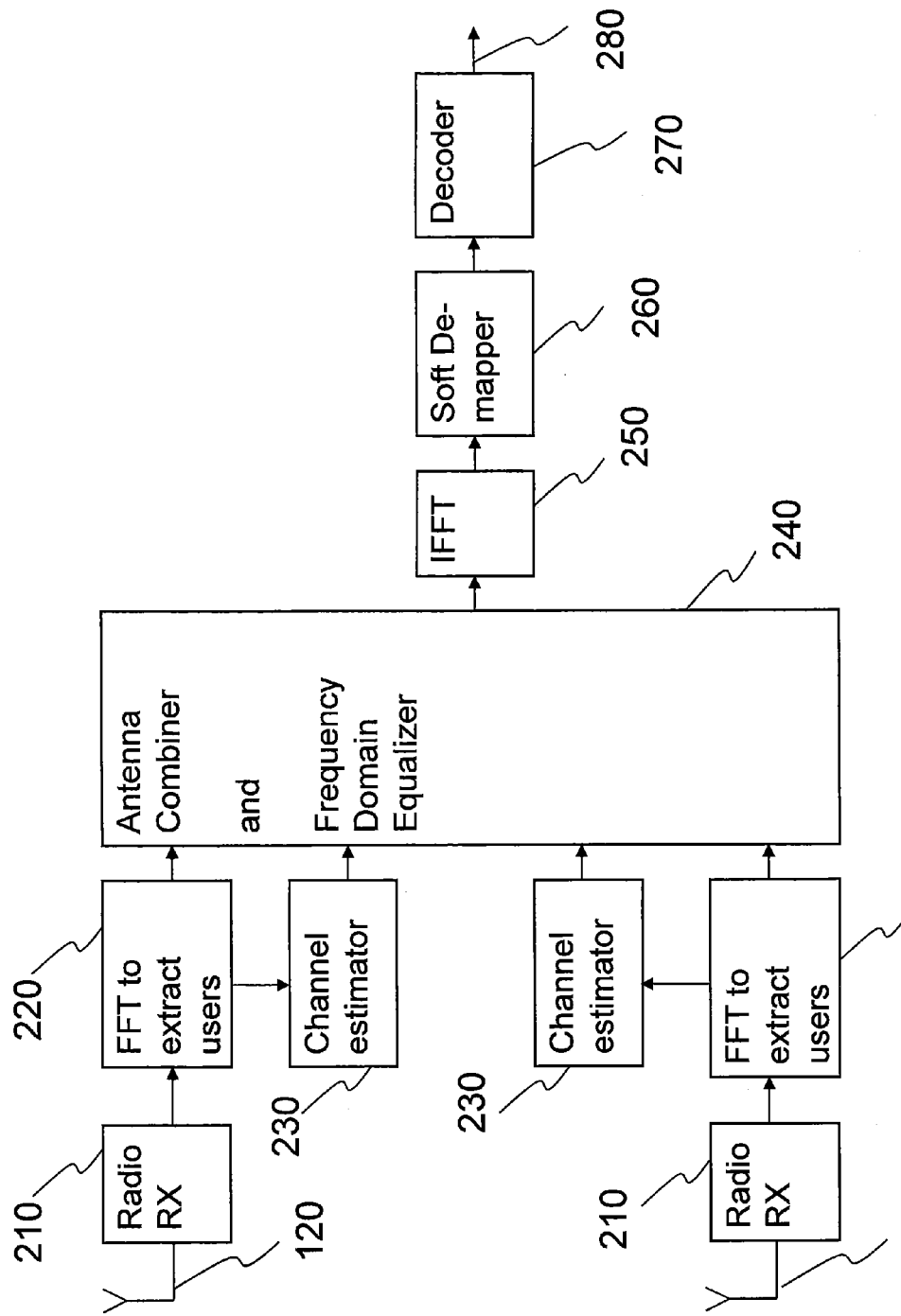
FIG. 2 is a schematic block diagram illustrating a receiver chain of the receiving node.

FIG. 2 illustrates the essential parts of a receiver chain of the receiving node 110. The radio signal that is received via receive antennas 120 is processed in one or more radio receivers 210. Then the received radio signal is transformed by one or more FFTs 220 into the frequency domain so that signals from different transmitting nodes, e g pertaining to User Equipments (UEs) of different of users, can be separated. Channel estimates per antenna and user are then produced by one or more channel estimators 230. The signals received via different antennas are then combined and equalized per user using respective channel estimates in antenna combiner and frequency domain equalizer 240. Each thus resulting extracted signal per user is then transformed back into the time domain by an IFFT 250, whereupon symbols of the respective signal are de-mapped to soft bits or soft values of coded bits by a soft-demapper 260, and finally the soft bits or soft values of the coded bits are decoded in a decoder 270 into a decoded signal 280. The decoder 270 may for example be a turbo decoder adapted to improve the soft bits or soft values of the coded bits and to output soft information comprising the improved soft bits or soft values of the coded bits in addition to the decoded signal 280. The decoded signal 280 may be output in form of decoded bits. As mentioned in the introductory section above, applying turbo equalization methods in the receiver chain illustrated in FIG. 2 would involve iteratively re-modulating the soft bits or soft values of coded bits into symbols, possibly as improved by the turbo decoder, and feeding them back into the receiver chain from equalizer to decoder, which means high computational complexity and requires a lot of computational power of the Digital Signal Processor (DSP).

The inventors have realized that advantages of turbo equalization can be better exploited and more efficient use can be made of the turbo equalizer or turbo equalization mode if instantaneous channel information such as fast-fading channel behavior is considered when determining whether it is worth-while to use turbo equalization in the decoding of a received radio signal. At some time instants, the instantaneous channel conditions may be such that acceptable gain from turbo equalization can be obtained, i e that ISI in the received radio signal can be reduced, although the overall channel delay spread indicates that the channel conditions are such that turbo equalization cannot improve the result of the decoding, i e provide a more accurate decoded signal. This is because channel delay spread is statistical channel information that does not keep track of the fast-fading channel behavior.

Figure 3:
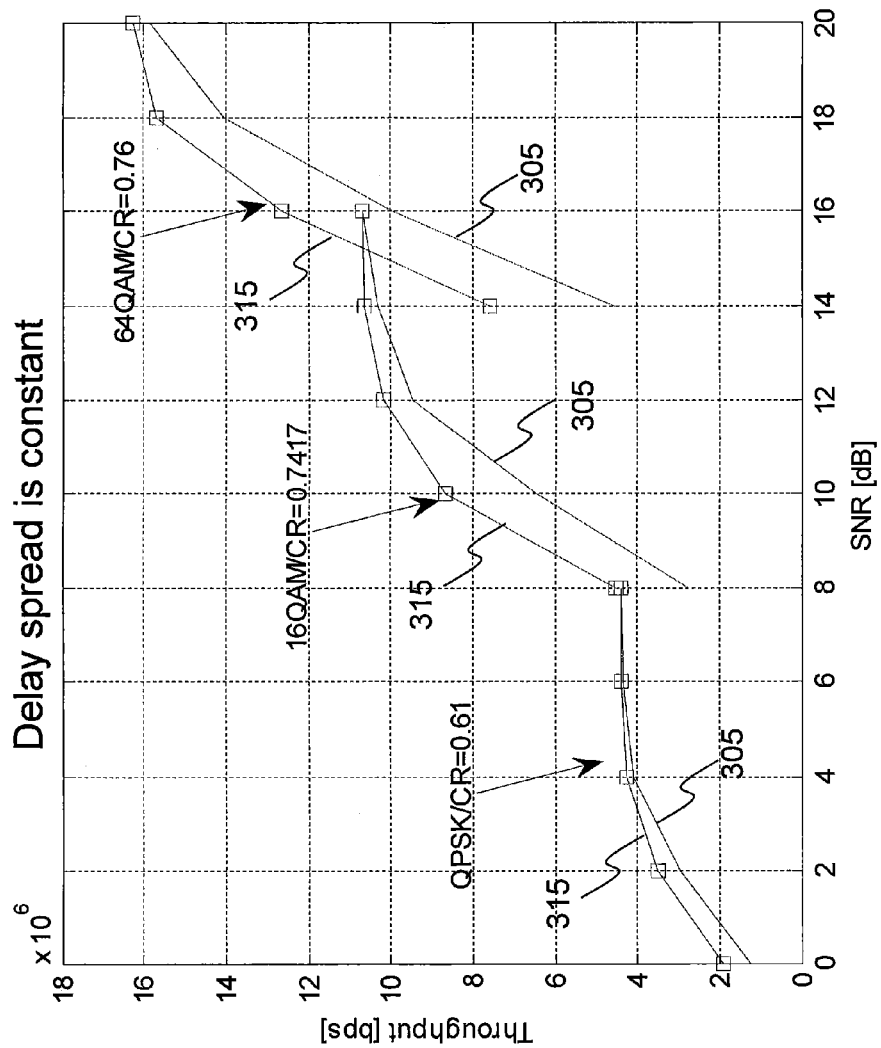
FIG. 3 is a diagram that illustrates throughput as a function of Signal-to-Noise Ratio (SNR) for different modulation orders and constant delay spread. The diagram illustrates the conditions for an EVA channel of 25 Resource Blocks (RB) with one transmit antenna (1TX) and two receive antennas (2RX) and for QPSK, 16QAM and 64QAM modulation.

Further, the inventors have also realized that the obtainable gain depends on other parameters such as modulation order and Signal-to-Noise Ratio (SNR) of the received radio signal. This is illustrated in FIG. 3, where throughput of an Extended Vehicular A (EVA) channel as defined in 3GPP with 25 Resource Blocks (RB) as a function of SNR is shown for respective first iterations 305 and fourth iterations 315 of a turbo equalizer for three different orders of modulation, i e QPSK, 16QAM and 64QAM. For the first iterations 305 no turbo equalization, i e no feedback of soft information, has been performed. For the fourth iterations 315, three rounds of feedback of soft information have been performed.

Among other things, it can be seen in this example that the gain can be marginal when low modulation order is used in low channel delay spread and low SNR cases. As a result, it may be more efficient to switch off the turbo equalization at low SNRs to keep computational complexity low. The example of FIG. 3 further shows that the gain in throughput may vary even if the channel delay spread is the same.

As a result of these considerations, the inventors have concluded that by predicting a turbo equalization gain based on instantaneous channel information and dynamically switching the turbo equalizer on/off depending on the predicted turbo equalization gain and a current error level in the result that is output from the decoder in the first iteration, e g as indicated by a Bit Error Rate (BER) indicator, the computationally complex steps of the feedback loop can be performed only when it may result in a sufficiently good output from the decoder, and otherwise be avoided. In this way waste of time and computational resource is prevented and the yield in terms of increased throughput from employing turbo equalization will be improved.

A threshold level that is independent of Signal-to-Interference-and-Noise Ratio (SINR) and bandwidth may de defined and used for determining when the obtainable output from the decoder is good enough to make it worthwhile to perform the computationally complex steps of the turbo equalizer. If it is not considered worthwhile to involve the turbo equalizer, e g if the channel conditions are bad and the data bits cannot be completely decoded even if the turbo equalizer is employed, the detection may stop and Non-Acknowledge (NACK) may be reported.

The predicted turbo equalization gain may be based on channel delay spread in addition to instantaneous channel information such as SINR. The number of iterations performed by the turbo equalizer may be limited by a maximum number.

The solution is applicable to Single Input Single Output (SISO) systems with one transmit antenna and one receive antenna as well as to Single Input Multiple Output (SIMO) systems with one transmit antenna and more than one receive antennas such as in the Uplink (UL) of an Long Term Evolution (LTE) system. Especially, it is applicable to fast fading channels, where it may be needed to switch the turbo equalizer or turbo equalization mode on and off instantaneously. The solution preserves the major part of the throughput gain provided by the turbo equalizer while substantially reducing the computational complexity of the equalizer. The equalizer may be implemented as a Decision-Feedback Equalizer (DFE) which falls back into a normal linear equalizer, e g a Minimum Mean Square Error (MMSE) equalizer, when the turbo equalizer or turbo equalization mode is switched off, i e when there is no feedback information from the decoder. This facilitates the implementation in that only one equalizer is implemented for both cases with/without feedback information.

Embodiments of the present disclosure will now be described in more detail with reference to FIG. 4. In this figure details of part of the receiver chain in a receiving node where a turbo decoder is used for the decoding of received signals are Illustrated. A received radio signal $s_{in}$ is demodulated and decoded into a decoded signal 445 by FFT 400, equalizer 410, IFFT 420, soft-demapper 430 and turbo decoder 440 in a manner corresponding to the description of the blocks 220-270 in relation to FIG. 2 above.

The turbo decoder 440 is configured to perform rate de-matching and de-interleaving of the soft bits or soft values of coded bits that are input to the turbo decoder 440 from soft-demapper 430. The turbo decoder 440 is further configured to improve or refine the soft bits or soft values of the coded bits so that the likelihood of interpreting the coded bits as a "zero" or as a "one" is increased and to output the improved soft bits or soft values of the coded bits as soft information 455 in addition to decoded bits of the decoded signal 445, which decoded bits are output in form of hard bits, i e ones and zeroes. The soft information 455 may be fed to switches 459 and 465 which switches when in closed positions, indicated by dashed lines in FIG. 4, close a feedback loop from the turbo decoder 440 to the equalizer 410, thereby causing the equalizer 410 to operate in a turbo equalization mode.

In the turbo equalization mode, the soft information 455 is rate matched and interleaved in interleaver 460 and mapped to soft symbols in soft-mapper 470. The output of interleaver 460 may further be fed into soft-demapper 430 and then deducted from the output of soft-demapper 430. The soft symbols are output from soft-mapper 470 in a regenerated signal. In addition to the mapping to soft symbols, soft-mapper 470 may compute an average soft symbol power of the soft symbols or a variance of the regenerated signal comprising the soft symbols. The thus re-generated soft symbols are then transformed into the frequency domain in FFT 475 and fed into equalizer 410 together with the average power of the re-generated soft symbols or the variance of the regenerated signal. The equalizer 410 further receives a channel estimate from channel estimator 480. The channel estimate is determined by the channel estimator 480 based on an input from FFT 400 of a representation of the received signal $s_{in}$ as transformed into the frequency domain by FFT 400.

Several different types and structures are possible for the equalizer 410. One possible example of a structure of the equalizer 410 is shown in FIG. 5. Therein, a filter coefficient calculator 511 is operatively connected to a Feed-Forward Filter (FFF) 512 and to a Feed-Backward Filter (FBF) 513. The filter coefficient calculator 511 receives the channel estimate from the channel estimator 480 and the average power of the re-generated soft symbols or variance of the regenerated signal from the soft-mapper 470 and calculates filter coefficients for the FFF 512 and FBF 513 based on the received channel estimate and average power of the re-generated soft symbols or variance of the regenerated signal. The filter coefficients are provided to the FFF 512 and FBF 513 to tune the operation of these fitters according to the channel distortion present in the received radio signal $s_{in}$. FFF 512 receives the received signal $s_{in}$ as represented in the frequency domain in form of frequency components from FFT 400 and filters the frequency components of the received signal $s_{in}$ to reduce or mitigate impact from linear channel distortion on the frequency components of the received signal $s_{in}$. FBF 513 receives the re-generated soft symbols as represented in the frequency domain in form of frequency components from FFT 475 and filters the frequency components of the re-generated soft symbols to extract or isolate frequency components that come from ISI in the received signal $s_{in}$. The frequency components that come from ISI are then deducted at summing junction 514 from the filtered frequency components of the received signal $s_{in}$ that are output from FFF 512 to form a resulting equalized received signal represented in the frequency domain. The equalized received signal is then output from the equalizer 410 and input to IFFT 420 to be processed as earlier described in relation to FIGS. 2 and 4.

In this way, to compensate for ISI, the equalizer 410 may operate in the turbo equalization mode wherein a combination of decoding and equalization is performed during the demodulation and decoding of the received signal $s_{in}$. Applying the turbo equalization mode is in this way in the receiving node 110 means that the equalizer 410, IFFT 420, soft-demapper 430, turbo decoder 440, interleaver 460, soft-mapper 470 and FFT 475 together perform the functions of a turbo equalizer. The turbo equalizer iteratively re-modulates soft information 455 that is output from the turbo decoder 440 into soft symbols and feeds the soft symbols back into the receiver chain from equalizer 410 to decoder 440 in a feedback loop to improve the result of the decoding.

Figure 4:
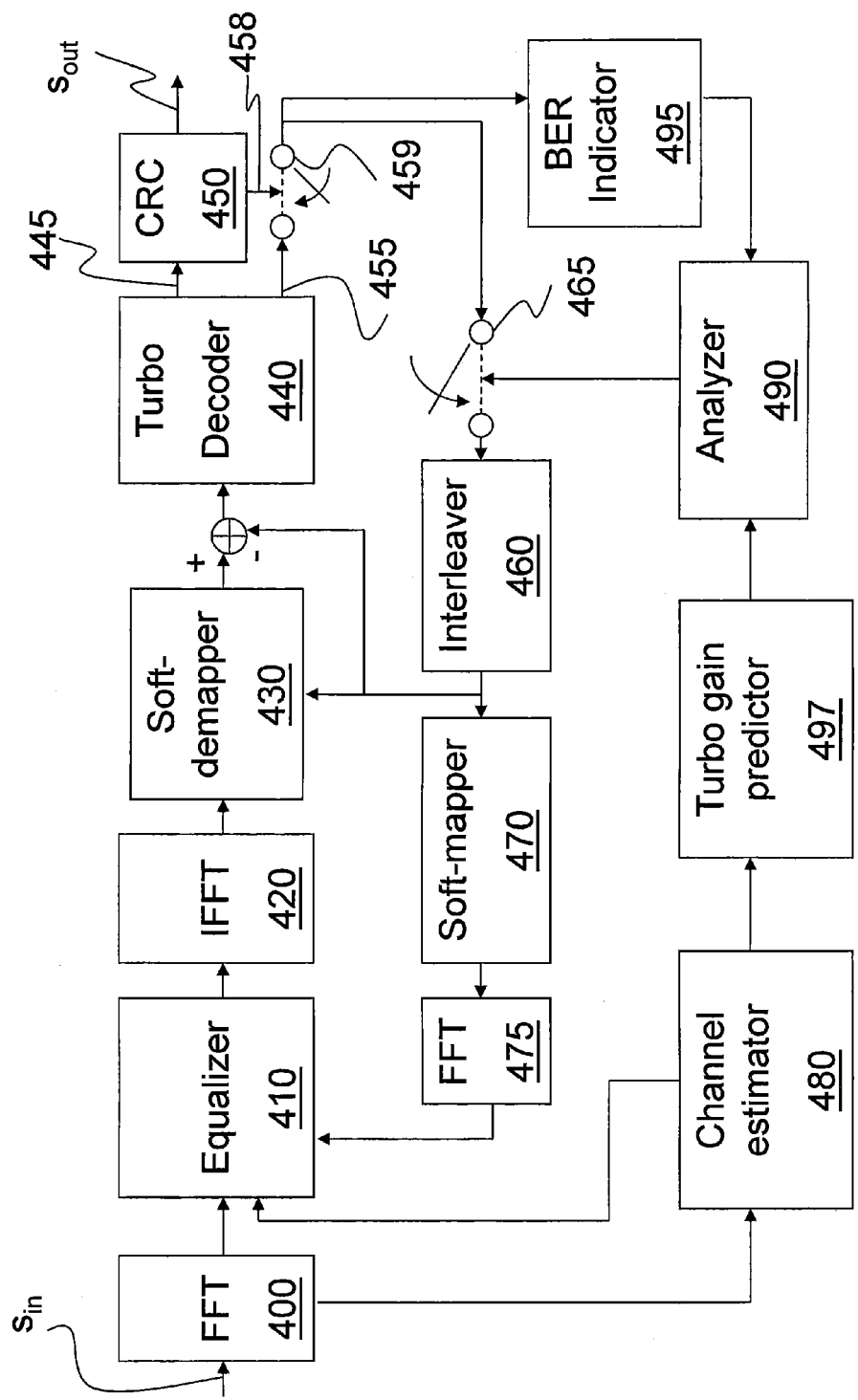
FIG. 4 is a schematic block diagram illustrating part of the receiver chain in a receiving node according to embodiments of the present disclosure.
Figure 5:
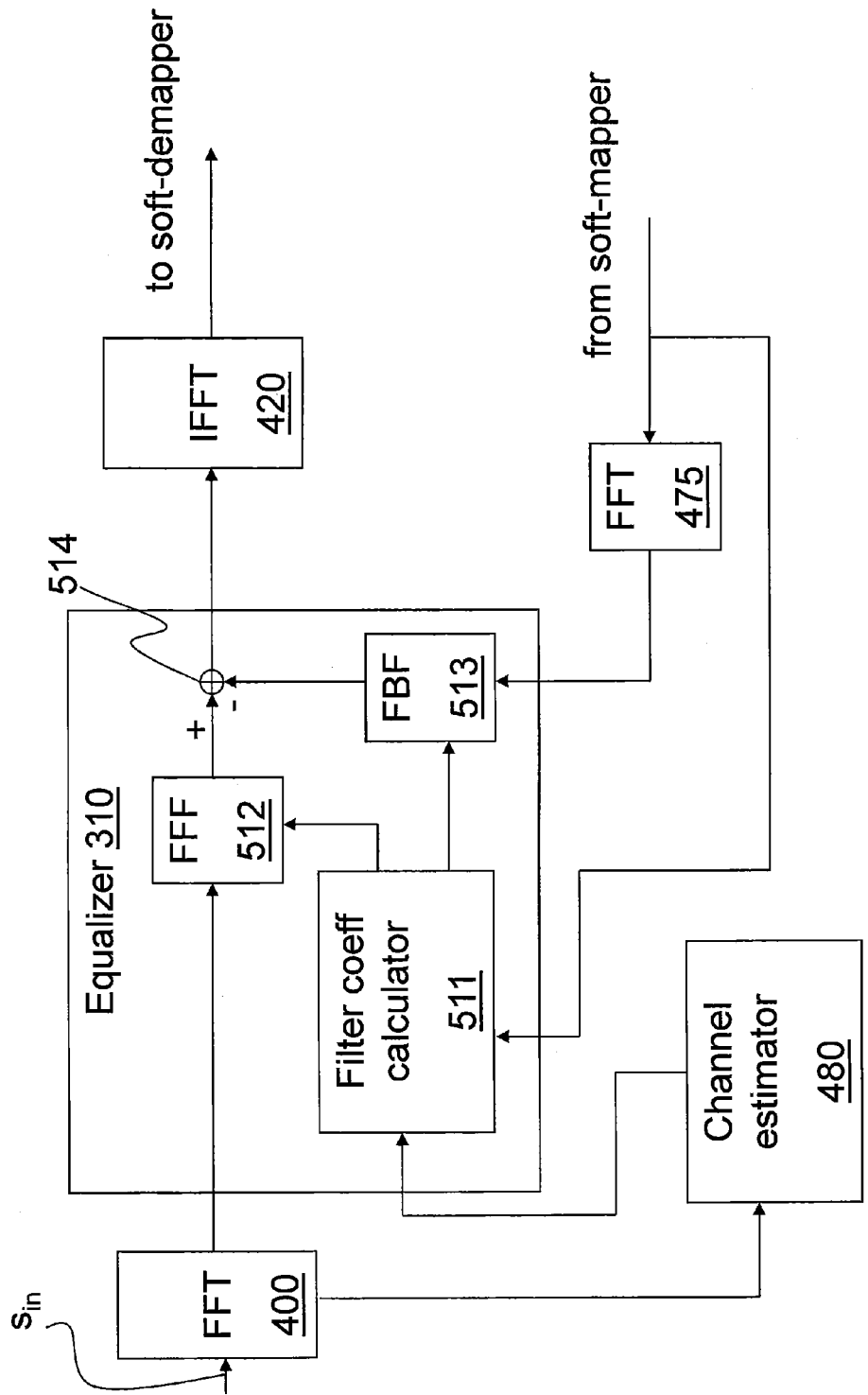
FIG. 5 is a schematic block diagram illustrating details of an equalizer operable in a turbo equalization mode.

On the other hand, when the switches 459 and 465 are in open positions, as indicated by sloping lines in FIG. 4, no feedback of information from the decoder 440 to the equalizer 410 will occur, and the equalizer 410 will operate in a "no feedback" mode, also denoted normal mode. When the equalizer 410 is operated in this mode, the filter coefficient calculator 511 receives the channel estimate from the channel estimator 480 and calculates filter coefficients for the FFF 512 based on the received channel estimate. The filter coefficients are provided to the FFF 512 to tune the operation of this filter according to the channel distortion present in the received radio signal $s_{in}$. FFF 512 receives the received signal $s_{in}$ as represented in the frequency domain in form of frequency components from FFT 400 and fitters the frequency components of the received signal $s_{in}$ to reduce or mitigate impact from linear channel distortion on the frequency components of the received signal $s_{in}$. The equalized received signal is then output from the equalizer 410 and input to IFFT 420 to be processed as earlier described in relation to FIGS. 2 and 4.

According to the present disclosure, an analyzer 490 is provided to determine whether the turbo equalization mode will be applied or not. The analyzer 490 is connected to a Bit Error Rate (BER) indicator 495 and to a turbo gain predictor 497. The analyzer 490 is further connected to the switch 465. The turbo gain predictor 497 is connected to the channel estimator 480. The BER indicator 495 is connected to the switch 459. The switch 459 is connected to the turbo decoder 440 and to the CRC 450. The turbo decoder 440 is configured to output the soft information 455 on a line connected to the switch 459 and to output the decoded bits of the decoded signal 445 on a line to CRC 450. CRC 450 is configured to perform a Cyclic Redundancy Check on the decoded signal 445 and to indicate FALSE, e g "0", on a line 458 to switch 459 if the decoded signal 445 is not error-free, and TRUE, e g "1", if it is error-free.

If the CRC 450 indicates that the decoded signal 445 is not error-free the switch 459 will switch to the closed position indicated by the dashed line in FIG. 4 and the soft information 455 will be provided to the BER indicator 495 and to the switch 465. The switch 465 is configured to be controlled by the analyzer 490 based on fulfillment of a condition, e g a predetermined condition, which is required to motivate use of the turbo equalization mode. If the condition for turbo equalization is fulfilled, the switch 465 will be caused by analyzer 490 to switch to the closed position indicated by the dashed line in FIG. 4 and the turbo equalization mode will be applied. Otherwise, i e if the condition for turbo equalization is not fulfilled, the switch 465 will be caused by analyzer 490 to switch to the open position indicated by the sloping line in FIG. 4 and the normal mode will be applied for equalization.

If CRC 450 indicates error-free decoding, the resulting error-free decoded signal $s_{out}$ may be output from CRC 450 as the final result of the decoding. In other circumstances, e g when CRC 450 does not indicate error-free decoding but the condition for turbo equalization is not fulfilled, the resulting decoded signal $s_{out}$ that may be output from CRC 450 as the final result of the decoding will not be error-free. In this case the receiving node 110 may report Non-Acknowledge (NACK) to the transmitting node 100, whereupon the transmitting node 100 may initiate a re-transmission.

As mentioned above, the soft information 455 that is output from the turbo decoder 440 will be provided to the BER indicator 495 when the switch 459 is in the closed position indicated by the dashed line in FIG. 4, i e when CRC 450 indicates that the decoded signal 445 is not error-free. The CRC detection serves as an indication as to whether BER is zero or non-zero. If BER is non-zero, soft information comprising the improved soft values of the coded bits may be used to indicate how many erroneous bits that are present in the result, i e in the decoded signal 445. If the improved soft values have high magnitudes, it means low BER. On the other hand, low magnitudes of the improved soft values mean high BER. This is because the improved soft values are Log Likelihood Ratios (LLRs) of bits and high LLR corresponds to high likelihood of the bit. This is to say, according to the formula (1) below, a high positive LLR corresponds to a high likelihood of the bit being a "one", whereas a high negative LLR corresponds to a high likelihood of the bit being a "zero".

The Log-Likelihood ratio is defined as:

$$\text{LLR} = \log\left[P(b_i=1|y_i)/P(b_i=0|y_i)\right] \quad (1)$$

where $b_i$ is the ith transmitted bit and $y_i$ is the corresponding received symbol as output from IFFT 420, and wherein P stands for probability and log for logarithm.

Accordingly, the BER indicator 495 is configured to determine a current error level in the decoded signal 445. The determination of the current error level may comprise determining an error measure from the improved soft values of the coded bits. To determine the error measure, various formations of LLR could be used, such as a linear function, an exponential function of LLR, and so on. One example of an exponential function of LLR is $$BEP = \frac{1}{1 + e^{(LLR)}}$$

whereby bit error probability (BEP) can be calculated, as disclosed in more detail in Bijan Rohani, Kambiz Homayoufar, "*Computation of Instantaneous Bit Error Probability from Log-Likelihood Ratio*", Technical report of IEICE. November 2008.

Thus, the error measure can be written as:

$$\overline{B} = E\{f(\text{LLR})\} \quad (2)$$

where f represents the relationship between LLR and BER levels, E means taking the expectation of f(LLR) over all coded bits. In other words, the error measure may be determined as an expectation value over the coded bits of a function that relates magnitudes of the improved soft values of the coded bits to bit error rate, "BER", levels.

In the above example, the determination of the current error level comprises performing a cyclic redundancy check, "CRC", of the decoded bits whereupon the determination of the error measure from the improved soft values of the coded bits is made when the CRC check indicates bit errors in the decoded bits. In an alternative embodiment, however, the CRC check may be omitted and the soft information 455 may be provided directly to BER indicator 495 and switch 465, thus making the switch 459 and output 458 from CRC 450 redundant. In any event, the BER indicator 495 is configured to provide the determined current error level to the analyzer 490 as an input for decision whether to apply the turbo equalization mode by controlling whether the switch 465 is held in open or closed position.

In addition to receiving the determined current error level from the BER indicator 495, analyzer 490 is also configured to receive a predicted turbo equalization gain from the turbo gain predictor 497. The turbo gain predictor 497 is configured to predict the turbo equalization gain based on instantaneous channel information of the radio channel $h_1$, $h_2$. For this purpose, the turbo gain predictor 497 is configured to receive the instantaneous channel information from the channel estimator 480. The instantaneous channel information may for example be expressed as channel responses per subcarrier and antenna.

The turbo equalization gain may be predicted as a difference between a first quality measure formed from the instantaneous channel information with feedback of soft information 455 and a second quality measure formed from the instantaneous channel information without feedback of soft information 455. The first and second quality measures may for example be based on SINR of the received radio signal $s_{in}$.

As an example, the first and second quality measures may be determined from post equalizer SINR, i e SINR that is determined for the equalized received signal as output from the equalizer 410. Post equalizer SINR can be computed for every instant channel realization from the formula:

$$SINR = \frac{\sigma_s^2 \left(N - \sum_{i=0}^{N-1} \frac{1}{D_i}\right)}{(\sigma_s^2 - \sigma_{\tilde{s}}^2) \sum_{i=0}^{N-1} \frac{1}{D_i}} \quad (3)$$

where $$D_i = 1 + (\sigma_x^2 - \sigma_{\tilde{s}}^2) \sum_{l=0}^{L-1} \frac{|H_l(i)|^2}{\sigma_{w_l}^2},$$

N is the total number of subcarriers, L is the total number of receive antennas, $\sigma_s^2$ is the transmitted signal variance, $\sigma_{\tilde{s}}^2$ is the regenerated signal variance, which is limited between $[0, \sigma_x^2]$, $\sigma_{w_l}^2$ is the noise variance at antenna l, $H_l(i)$ is the channel response at subcarrier i and antenna l. The variances of transmitted signal, regenerated signal and noise are in this example power normalized. The transmitted signal variance and the noise variance may for example be obtained from the channel estimator 480. The variance of the regenerated signal may be determined by the soft-mapper 470. In embodiments where the mean value of the amplitude of the regenerated signal is zero the variance of the regenerated signal is equivalent to the average power of the re-generated soft symbols as determined by soft-mapper 470.

The first quality measure may be determined by assuming that symbols of the equalized received signal that are output from the equalizer 410 in the first iteration or stage of decoding are all correct. This implies that the soft symbols regenerated by soft-mapper 470 may be assumed to be all correct. Thereby the regenerated signal variance may be assumed to be equal to the transmitted signal variance, i e it may be assumed that $\sigma_{\tilde{s}}^2 = \sigma_s^2$, whereby a final SINR, i e a SINR that is computed for the equalized received signal as output from equalizer 410 in a last iteration or stage of decoding with feedback of soft information 455 may be computed or predicted from equation (3) above. This means that in this case perfect feedback of soft information is assumed, so that the symbols of the equalized received signal would after the last iteration or stage be equivalent to the symbols of the originally transmitted signal. In this way, the first quality measure may be determined by assuming that the soft information 455 indicates error-free decoding of the received radio signal $s_{in}$. The first quality measure may thus be formed to reflect predicted SINR of the received radio signal $s_{in}$ after equalization if error-free decoding of the received radio signal $s_{in}$ using feedback of soft information 455 can be obtained.

The second quality measure may be determined by assuming that no feedback of soft information 455 is available to refine the symbols of the equalized received signal that are output from the equalizer 410 in the first iteration or stage of decoding. This means that there will be no regenerated soft symbols from the soft-mapper 470 and the regenerated signal variance is assumed to be zero, i e $\sigma_{\tilde{s}}^2 = 0$. An initial SINR may then be computed for the equalized signal as output from equalizer 410 in the first iteration or stage of decoding without feedback of soft information 455. The second quality measure may thus be formed as the initial SINR to reflect SINR of the received radio signal $s_{in}$ after equalization if the received radio signal $s_{in}$ is decoded without using feedback of soft information 455.

The difference between the first quality measure and the second quality measure may then be expressed as a difference between these two SINRs, i e between the predicted final SINR and the initial SINR, according to equation (4) below. This difference is called the gain of the turbo equalizer or turbo equalization gain G.

$$G = SINR(\sigma_{\tilde{s}}^2 = \sigma_s^2) - SINR(\sigma_{\tilde{s}}^2 = 0) \quad (4)$$

wherein $SINR(\sigma_{\tilde{s}}^2 = \sigma_s^2)$ denotes the predicted final SINR or first quality measure and $SINR(\sigma_{\tilde{s}}^2 = 0)$ denotes the initial SINR or second quality measure. The turbo equalization gain G shows the SINR improvement if the turbo equalizer can correctly decode all data bits. The turbo gain predictor 497 is configured to provide the predicted turbo equalization gain to the analyzer 490 as an input for decision whether to apply the turbo equalization mode by controlling whether the switch 465 is held in open or closed position.

The analyzer 490 is thus configured to decide whether to apply the turbo equalization mode depending on the predicted turbo equalization gain and the determined current error level in the decoded signal 445. In other words, the analyzer 490 is responsible for making decisions about information feedback to the equalizer 410. The analyzer 490 may be configured to decide whether to apply the turbo equalization mode by checking if a decision measure fulfils a condition, for example a predetermined condition, that is required to motivate use of the turbo equalization mode. For example, the analyzer 490 can decide if it is worth applying feedback information to the equalizer 410 based on the predicted turbo equalization G and current error level comprising the error measure or BER level $\overline{B}$ according to equation (5):

$$Decision = \begin{cases} Yes & F\{G, \overline{B}\} \geq T \\ No & F\{G, \overline{B}\} < T, \end{cases} \quad (5)$$

where F is a decision measure formed from the predicted turbo equalization gain and the determined current error level as a combination function of G and $\overline{B}$ and wherein the upper row in equation (5) expresses that the decision will be "yes" to applying the turbo equalization mode if the decision measure F is at or above a threshold level T whereas the lower row in equation (5) expresses that the decision will be 'no' to applying the turbo equalization mode if the decision measure F is below the threshold level T. In this example, the condition is thus fulfilled when the decision measure F is at or above the threshold level T.

The decision measure constitutes a measure of the total improvement obtainable from using the turbo equalizer or turbo equalization mode based on the current BER level. The decision measure should preferably be formed to reflect a probability of error-free decoding of said received radio signal $s_{in}$. For example, the decision measure may be defined as one of the below functions (6) or (7).

1. $F\{G, \overline{B}\} = \alpha\sqrt{G} + \{|LLR|\}$ \hfill (6)

2. $F\{G, \overline{B}\} = E\{e^{\alpha\sqrt{G} + |LLR|}\}$ \hfill (7)

where α is a constant that is independent of channel state information, such as SINR and delay spread. α may in some embodiments be a value selected from the interval [0.1, 1.5], e g 0.3 or 1.0, but other values from other intervals are also possible depending on the specific application. E stands for taking the Expectation of the argument following E over all coded bits.

However, other functions or combination functions that reflect a probability of error-free decoding of said received radio signal $s_{in}$ are also conceivable for use as the decision measure. Further, in some embodiments where the analyzer 490 is configured to also take channel delay spread into account for deciding whether to apply the turbo equalization mode, the decision measure F may further depend on the channel delay spread of the received radio signal $s_{in}$. The channel delay spread may in such embodiments be provided to the analyzer 490 by turbo gain predictor 497 based on information provided by channel estimator 480.

As mentioned above, the result from determining or calculating the decision measure F may be compared to a threshold level T to determine whether the condition for applying the turbo equalization mode is fulfilled. If the result exceeds the threshold, then it is advantageous to use the feedback loop of the turbo equalization mode. Otherwise, using the feedback loop of the turbo equalization mode may be regarded as a waste of power as the likelihood to have error-free decoding is very slim or small. Thus, the turbo equalization mode may be switched on, i e switch 465 may be caused to move to the closed position, when said decision measure is or goes above said threshold level and switched off, i e switch 465 may be caused to move to the open position, when said decision measure is or falls below said threshold level.

In some embodiments, the threshold level T may depend on a maximum number or maximally allowable number of stages or iterations that may be applied for the turbo equalization mode. It should be noticed that the threshold level T is a design parameter that may also depend on modulation and coding rate of the received radio signal $s_{in}$ in addition to or alternatively to dependence on the maximally allowable number of stages or iterations that can be called by the turbo equalizer. If the maximally allowable number of stages or iterations is small, a harsh requirement is put on the total improvement and a relatively high threshold level T should preferably be used. It is further worth mentioning as an advantage that the threshold level T is independent of SNR and bandwidth, because they are taken into account in the calculation of the turbo equalization gain G. As a result, the determination of suitable threshold levels for a large amount of test cases is facilitated as there is no need to take these parameters into account when defining threshold levels for different scenarios.

The herein disclosed receiving node and method for determining when to apply the turbo equalization mode to compensate for ISI in the received radio signal are applicable in an example where the received radio signal $s_{in}$ comprises turbo encoded symbols. FFT 400 is then configured to perform Fourier transformation of the turbo encoded symbols into the frequency domain and to forward the transformed turbo encoded symbols to equalizer 410. The equalizer 410 is configured to perform equalization of the transformed turbo encoded symbols in the frequency domain and to forward the equalized transformed turbo encoded symbols to IFFT 420. The IFFT 420 is configured to perform an inverse Fourier transformation of the equalized transformed turbo encoded symbols into equalized symbols in time domain and to forward the equalized symbols to soft-demapper 430. The soft-demapper 430 is configured to perform soft de-mapping of the equalized symbols into soft values of coded bits and to forward the soft values of the coded bits to turbo decoder 440. The turbo decoder 440 is configured to perform turbo decoding of the soft values of the coded bits into the decoded signal 445 and soft information 455.

Further, when the turbo equalization mode is applied in this example, interleaver 460 is configured to interleave the soft information 455 and soft-mapper 470 is configured to map the soft information 455 to soft symbols. Further, FFT 475 is configured to transform the soft symbols into the frequency domain and to feed back the transformed soft symbols to the equalizer 410. The equalizer 410 is configured to perform equalization by filtering the transformed turbo encoded symbols through a feed-forward filter 512 and filtering the transformed soft symbols through a feed-backward filter 513 and to combine the filtered transformed turbo encoded symbols with the filtered transformed soft symbols at summing junction 514. Filter coefficient calculator 511 is configured to calculate filter coefficients for the feed-forward filter 512 and for the feed-backward filter 513 from channel estimates of the received radio signal $s_{in}$ and from the average power of the soft symbols or the variance of the regenerated signal comprising the soft symbols.

In short, the operation of the turbo equalizer according to the present disclosure can be summarized as follows: By utilizing the estimated channel information, the equalizer provides estimated symbols that are passed to the soft-demapper, which computes soft values (LLR) for every coded bit. The LLR is fed into turbo decoder to obtain decoded bits and refined LLR. If the CRC after turbo decoder is correct, it means that all data bits have been successfully decoded and that feedback is not necessary. If the CRC is wrong, it means there are erroneous bits and that turbo equalization might be needed. An analyzer is employed to determine whether turbo equalization should be used. If the condition for turbo equalization is fulfilled, the refined LLR is mapped to soft symbols, and fed back to the equalizer to cancel ISI. If the condition for turbo equalization is not fulfilled, it means that the link is bad and that the data bits cannot be completely decoded even if turbo equalization is employed. In order to save computational resource, the detection stops and NACK is reported. The analyzer makes the decision based on inputs from a turbo gain predictor and a BER indicator. The turbo gain predictor computes how much gain that can be achieved by using turbo equalization. The BER indicator makes use of refined LLR of coded bits to represent the error level in the results.

It is possible to switch on/off the turbo equalizer on the fly. This is beneficial for fast fading channels as it fully exploits the potential gain of the turbo equalizer. As the turbo equalizer in SIMO systems can achieve noticeable gain at high SNRs and large bandwidth, it is practical to switch on the turbo equalizer in certain time instants when it is favored, and switch it off when a bad link is present.

Simulations have shown that the major part of throughput gain achieved by using turbo equalization is captured by using the suggested approach, while the complexity is significantly reduced. These improvements relieves heavy computational burden from the DSPs and improves the efficiency of a DSP. Further, the complexity of the proposed method is relatively low. It makes use of the existing parameters in the equalizer and turbo decoder, and only simple calculations are involved in the follow up process.

Figure 6:
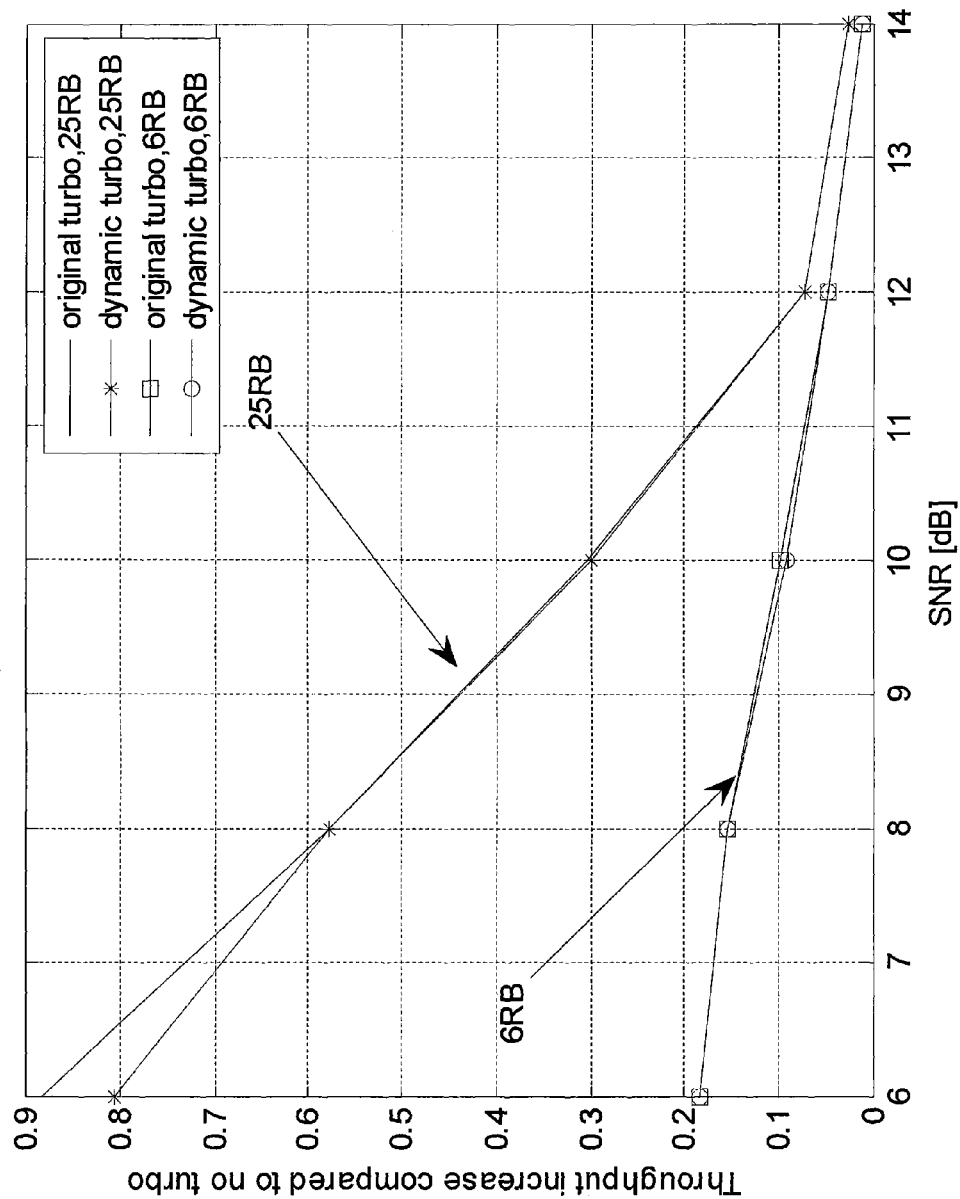
FIG. 6 is a diagram illustrating throughput improvement achieved according to embodiments of the present disclosure.

Improvement of throughput by using turbo equalizer all the time and switch on/off is shown in FIG. 6. The throughput improvement is defined as:

$$\Delta T = \frac{T_{turbo} - T_{no\_turbo}}{T_{no\_turbo}},$$

where $T_{turbo}$ is the throughput by using turbo equalizer and $T_{no\_turbo}$ is the throughput using traditional linear MMSE equalizer.

In this example, 16-QAM with coding rate 0.7417 is selected to transmit over EVA channel with 25 RBs and 6 RBs. The maximal stage number is 3, including the $1^{st}$ stage. The analyzer or decision measure is simply taken as:

$$F\{G,\overline{B}\} = \sqrt{G} + E\{|LLR|\}$$

The same threshold is used for the entire SNR region and different bandwidth. It is observed that, by using turbo equalizer all the time, the throughput of 25RBs can be increased by 88% at low SNR and by 3% at high SNR compared to the case when a normal linear equalizer is used. Switch on/off of turbo equalizer increases the throughput between 81% and 3%, which achieves almost the same gain as achieved by using turbo equalizer all the time. A noticeable degradation occurs when SNR<8 dB, which is not a realistic scenario for using 16QAM/CR=0.7417 if link adaptation is employed. In case of 6RBs, the difference in throughput is negligible.

Figure 7:
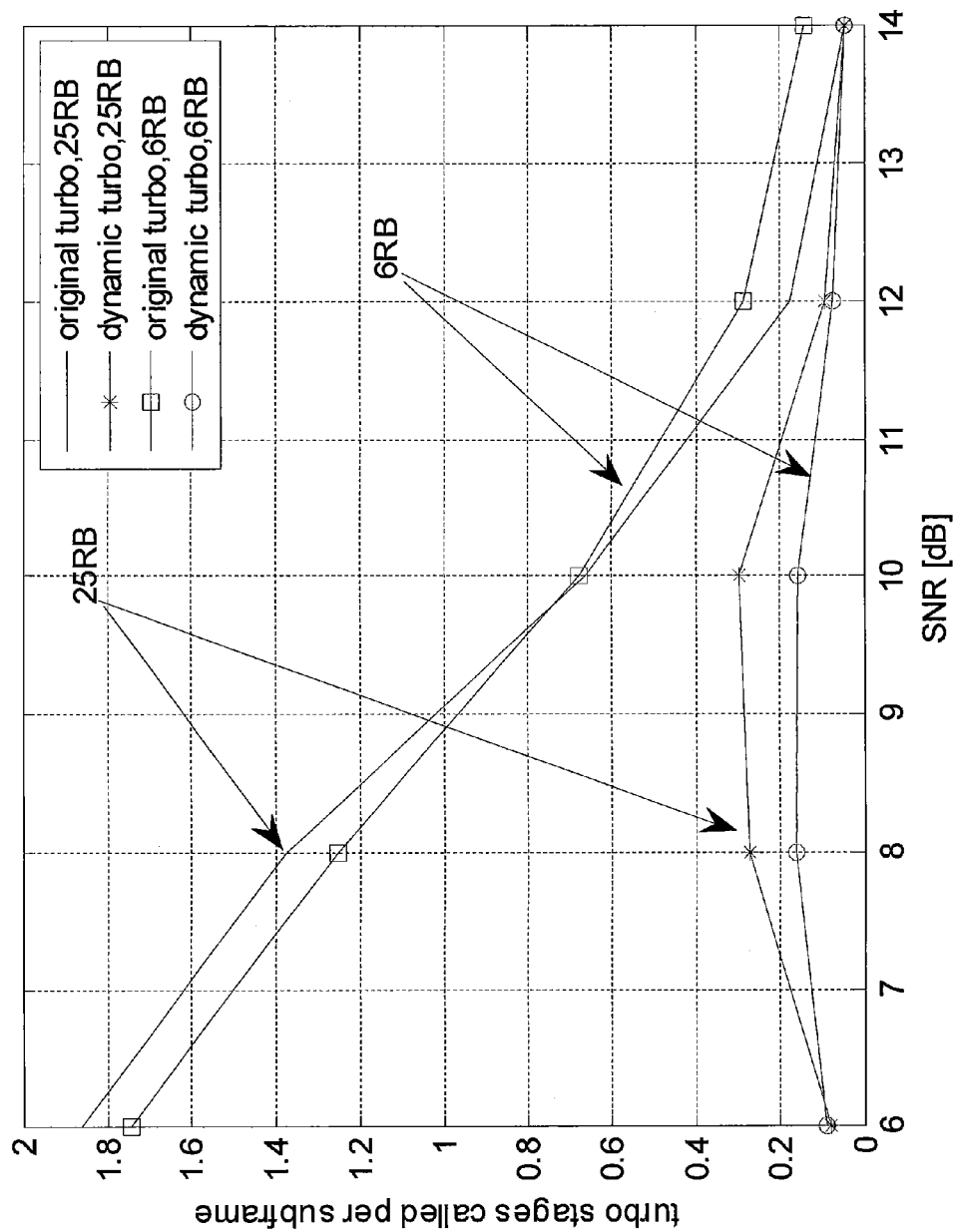
FIG. 7 is a diagram illustrating turbo stages, i e iterations, called per subframe as a function of SNR.

On the other hand, the computational complexity needed to achieve the throughput shown in FIG. 6 is shown in FIG. 7 for all cases. The complexity is represented by extra number of turbo stages needed for one subframe, i.e., except the first stage that is needed for both the turbo equalizer and the normal linear equalizer, how many extra stages that are consumed. If the turbo equalizer is switched on all the time, it will only stop either when CRC is correct or the maximal number of stages is reached. In the case of 25RBs, using original turbo equalizer, i e a turbo equalizer that is switched on all the time, requires up to 1.86 extra stages per subframe, while the switch on/off turbo equalizer only 5 needs maximum 0.3 extra stages per subframe. The overall extra stages needed for the switch on/off turbo is less than 0.3 per subframe. In other words, only 1 extra turbo stage is needed for every 3.3 subframes to achieve the potential gain of turbo equalization. In the case of 6RBs, the extra stages can be limited to 0.16.

Figure 8A:
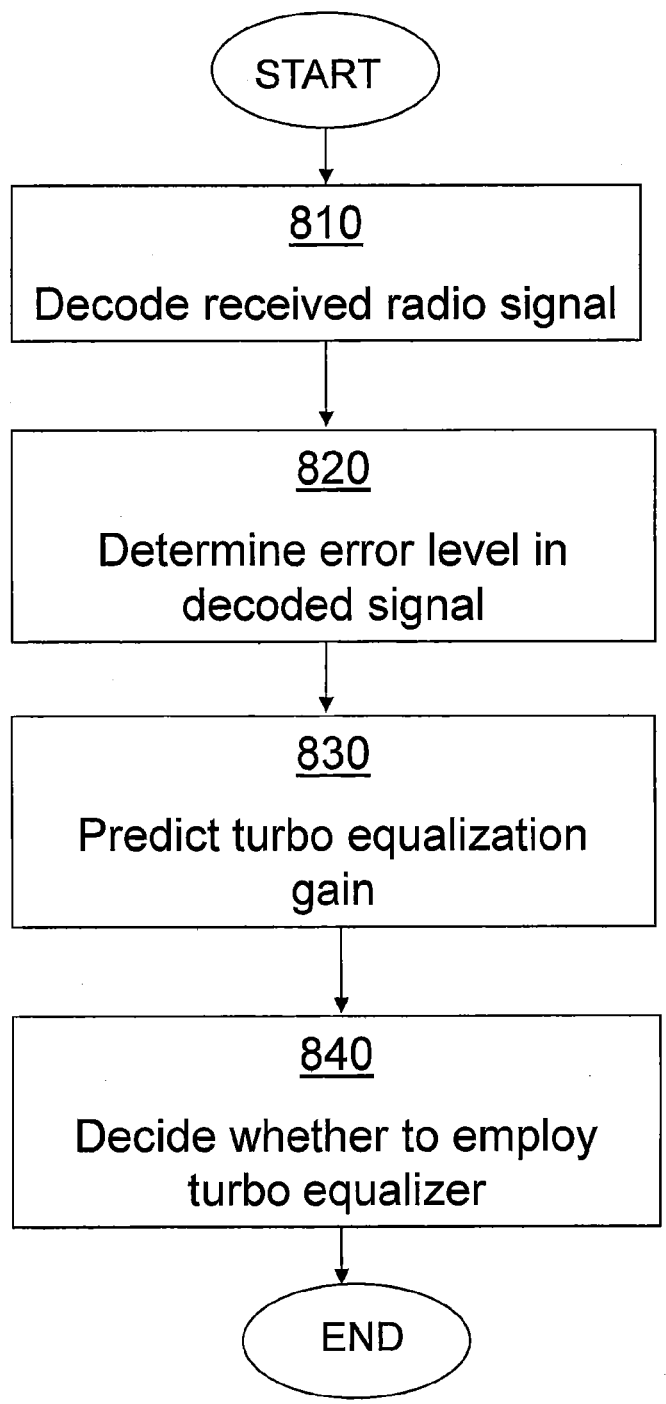
FIG. 8A is a flow chart illustrating a method according to an embodiment of the present disclosure.

FIG. 8A is a flowchart of the method in the receiving node 110 for determining when to apply the turbo equalization mode to compensate for Inter-Symbol Interference, "ISI", in a radio signal $s_{in}$. As mentioned above, the radio signal $s_{in}$ is received by the receiving node 110 over a radio channel $h_1$, $h_2$ from the transmitting node 100. The method comprises the steps:

810  The receiving node 110 decodes the received radio signal $s_{in}$ into a decoded signal 445.
820  The receiving node 110 determines a current error level in the decoded signal 445.
830  The receiving node 110 predicts a turbo equalization gain based on instantaneous channel information of the radio channel $h_1$, $h_2$.

-continued

840  The receiving node 110 decides whether to apply the turbo equalization mode depending on the predicted turbo equalization gain and the determined current error level in the decoded signal 445.

Figure 8B:
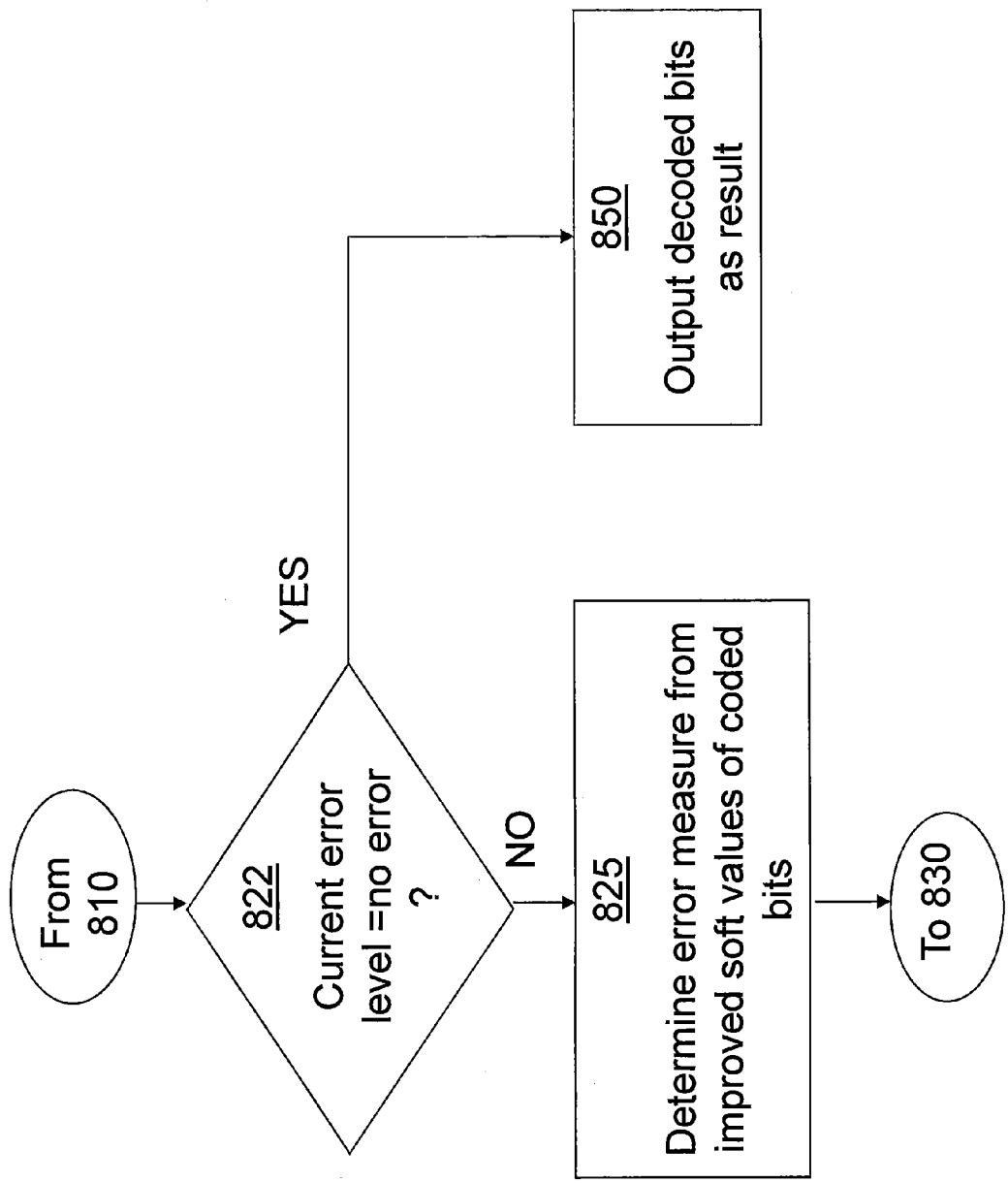
FIG. 8B is a flow chart illustrating a method according to another embodiment of the present disclosure.

FIG. 8B is a flow chart illustrating the method according to another embodiment of the present disclosure, wherein the method step 820 above further comprises the following steps to determine the current error level in the decoded signal 445:

822  The receiving node 110 performs a cyclic redundancy check, "CRC", of decoded bits of the decoded signal 445.
     When the CRC indicates that the current error level is greater than zero, ie that there are errors in the decoded bits, the method continues at step 825. When the CRC indicates that the current error level is zero, ie that there are no errors in the decoded bits, the method continues at step 850.
825  The receiving node 110 determines an error measure from soft information that comprises improved soft values of coded bits.
     In some embodiments, the error measure may be determined as an expectation value over the coded bits of a function that relates magnitudes of the improved soft values of the coded bits to bit error rate, "BER", levels. The method then continues at step 830 according to the embodiment of FIG. 8A.
850  The receiving node 110 outputs the decoded bits as a resulting decoded signal ($s_{out}$).

According to this embodiment, the receiving node 110 performs step 822 after performing step 810 according to the embodiment of FIG. 8A.

Figure 8C:
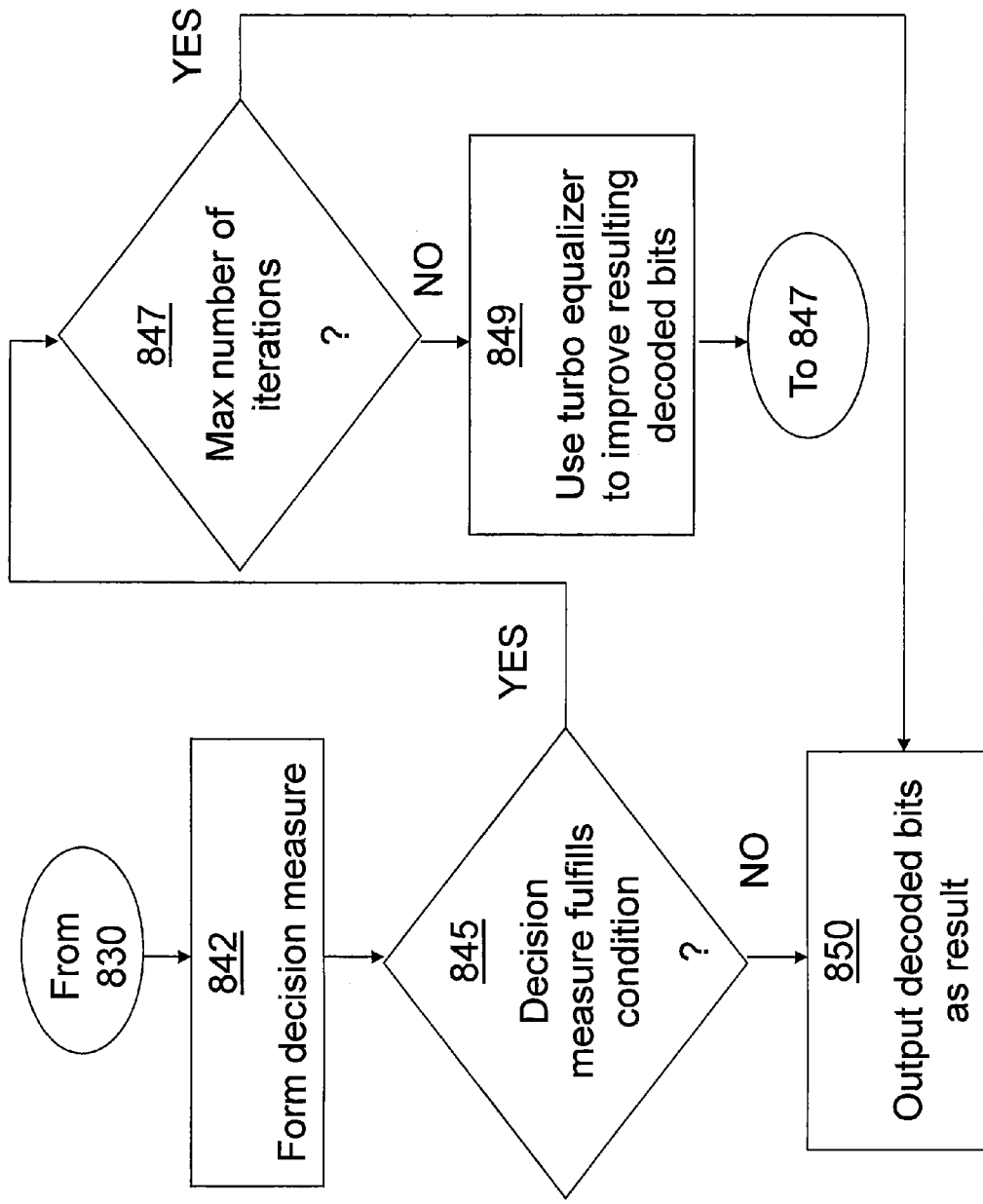
FIG. 8C is a flow chart illustrating a method according to a further embodiment of the present disclosure.

FIG. 8C is a flow chart illustrating the method according to a further embodiment of the present disclosure, wherein the method step 840 above further comprises the following steps to decide whether to apply the turbo equalization mode to compensate for ISI in the radio signal $s_{in}$:

842  The receiving node 110 forms a decision measure from the predicted turbo equalization gain and the determined current error level. The decision measure may in some embodiments reflect a probability of error-free decoding of said received radio signal $s_{in}$.
845  The receiving node 110 checks if the decision measure formed from the predicted turbo equalization gain and the determined current error level fulfils a condition, eg a predetermined condition, which fulfilment is required to motivate use of the turbo equalization mode. The condition may in some embodiments be fulfilled when the decision measure is at or above a threshold level. The threshold level may in further embodiments depend on a maximum number of iterations that may be applied or set for the turbo equalization mode. The threshold level may additionally depend on modulation and coding rate of the received radio signal $s_{in}$, but be independent of SINR and bandwidth of the received radio signal $s_{in}$. When the decision measure fulfills the condition, the method continues at step 847. When the decision measure does not fulfill the condition, the method continues at step 850.
847  The receiving node 110 checks if a maximum number of iterations has been set for the turbo equalization mode and, if a maximum number of iterations has been set the receiving node also checks if the maximum number of iterations has been reached. If no maximum number has been set, or if the maximum number of iterations has not been reached, the method continues at step 849. If the maximum number of iterations has been reached, the method continues at step 850.
849  The receiving node 110 applies the turbo equalization mode to improve the resulting decoded bits. Unless CRC indicates that the current error level is zero, ie that there are no errors in the decoded bits, the method continues at step 847. If there are no errors in the decoded bits, the method continues at step 850.
850  The receiving node 110 outputs the decoded bits as a resulting decoded signal $s_{out}$.

According to this embodiment, the receiving node 110 performs step 842 after performing steps 810-830 according to the embodiment of FIG. 8A or after performing steps 810 and 830 according to the embodiment of FIG. 8A and step 820 in accordance with the further steps of the embodiment according to FIG. 8B.

Figure 9A:
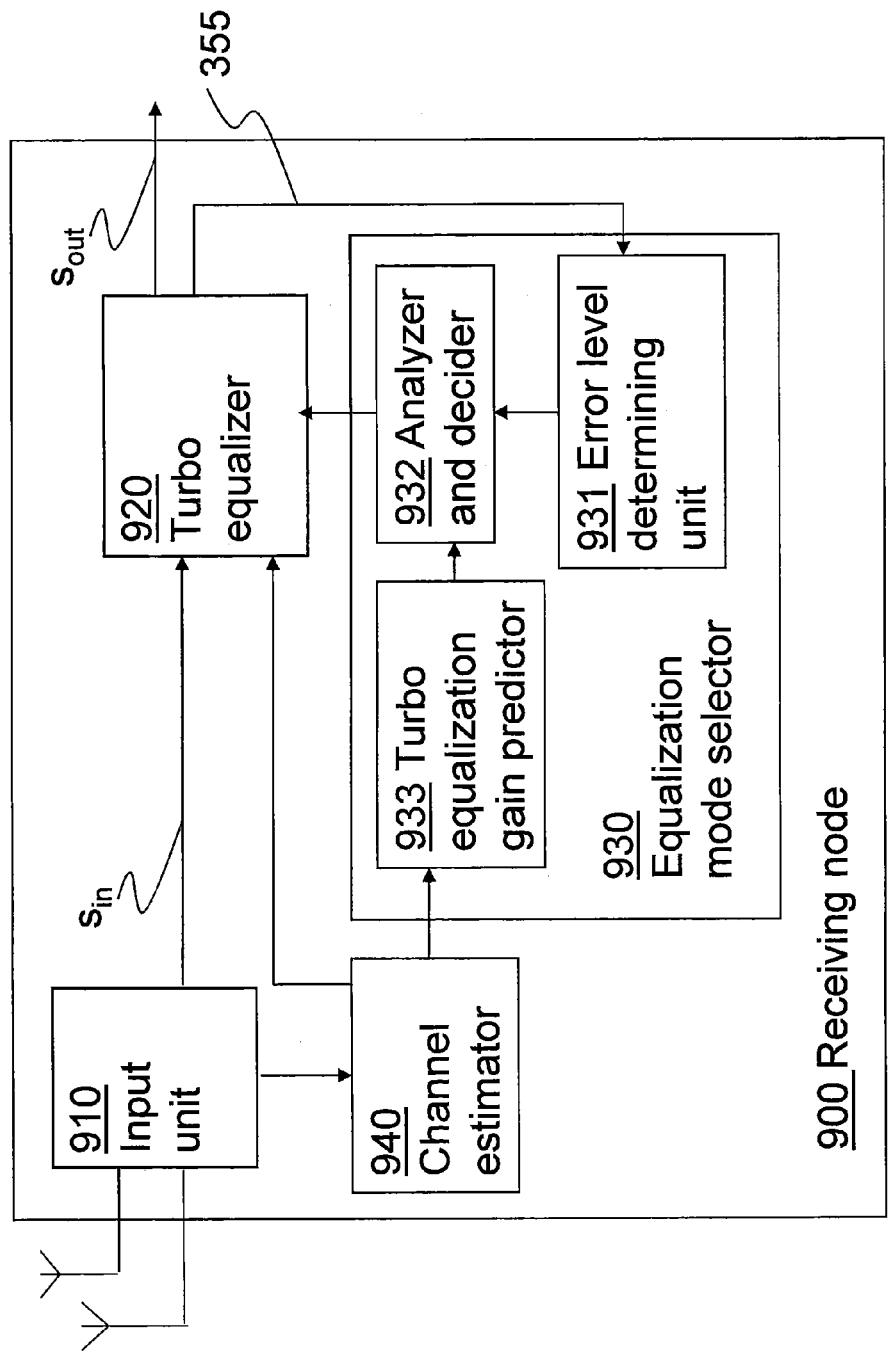
FIG. 9A illustrates schematically a receiving node according to an embodiment of the present disclosure.

To perform the method steps for determining when to apply the turbo equalization mode to compensate for ISI in a radio signal $s_{in}$, the receiving node 110, 900 comprises structural elements as depicted in FIG. 9A. The receiving node 900 comprises a turbo equalizer 920, an equalization mode selector 930 and a channel estimator 940. The equalization mode selector 930 is operatively connected to the turbo equalizer 920 and the channel estimator 940 is operatively connected to the turbo equalizer 920 and to the equalization mode selector 930. The receiving node 900 further comprises an input unit 910 which is operatively connected to the turbo equalizer 920 and the channel estimator 940.

The input unit 910 is configured to receive the radio signal $s_{in}$ over the radio channel from the transmitting node 100 and to provide the received radio signal $s_{in}$ to the turbo equalizer 920 and to the channel estimator 940.

The turbo equalizer 920 is configured to decode the received radio signal $s_{in}$ into a decoded signal 445 and to selectively operate in a turbo equalization mode to compensate for Inter-Symbol Interference, "ISI", in the received radio signal $s_{in}$.

The equalization mode selector 930 is configured to determine a current error level in the decoded signal 445 and to predict a turbo equalization gain based on instantaneous channel information. Further, the equalization mode selector 930 is configured to decide whether to apply the turbo equalization mode depending on the predicted turbo equalization gain and the determined current error level in the decoded signal 445.

The channel estimator 940 is configured to provide said instantaneous channel information to the equalization mode selector 930. The channel estimator 940 may also be configured to provide the instantaneous channel information to the turbo equalizer 920.

The equalization mode selector 930 may in some embodiments further comprise an error level determining unit 931, a turbo equalization gain predictor 933 and an analyzer and decider 932. The analyzer and decider 932 is operatively connected to the error level determining unit 931 and to the turbo equalization gain predictor 933. The analyzer and decider 932 and the error level determining unit 931 are further operatively connected to the turbo equalizer 920. The turbo equalization gain predictor 933 is further operatively connected to the channel estimator 940.

The error level determining unit 931 is configured to determine the current error level in the decoded signal 445 by determining an error measure from improved soft values of coded bits 455.

The turbo equalization gain predictor 933 is configured to predict the turbo equalization gain as a difference between a first quality measure and a second quality measure. The first quality measure is formed from the instantaneous channel information with feedback of the improved soft values of the coded bits 455. The second quality measure is formed from the instantaneous channel information without feedback of the improved soft values of the coded bits 455.

The analyzer and decider 932 is configured to decide whether to apply the turbo equalization mode by comparing a decision measure formed from the predicted turbo equalization gain and the determined current error level in the decoded signal 445 to a threshold level. The decision measure may reflect a probability of error-free decoding of the received radio signal $s_{in}$.

Figure 9B:
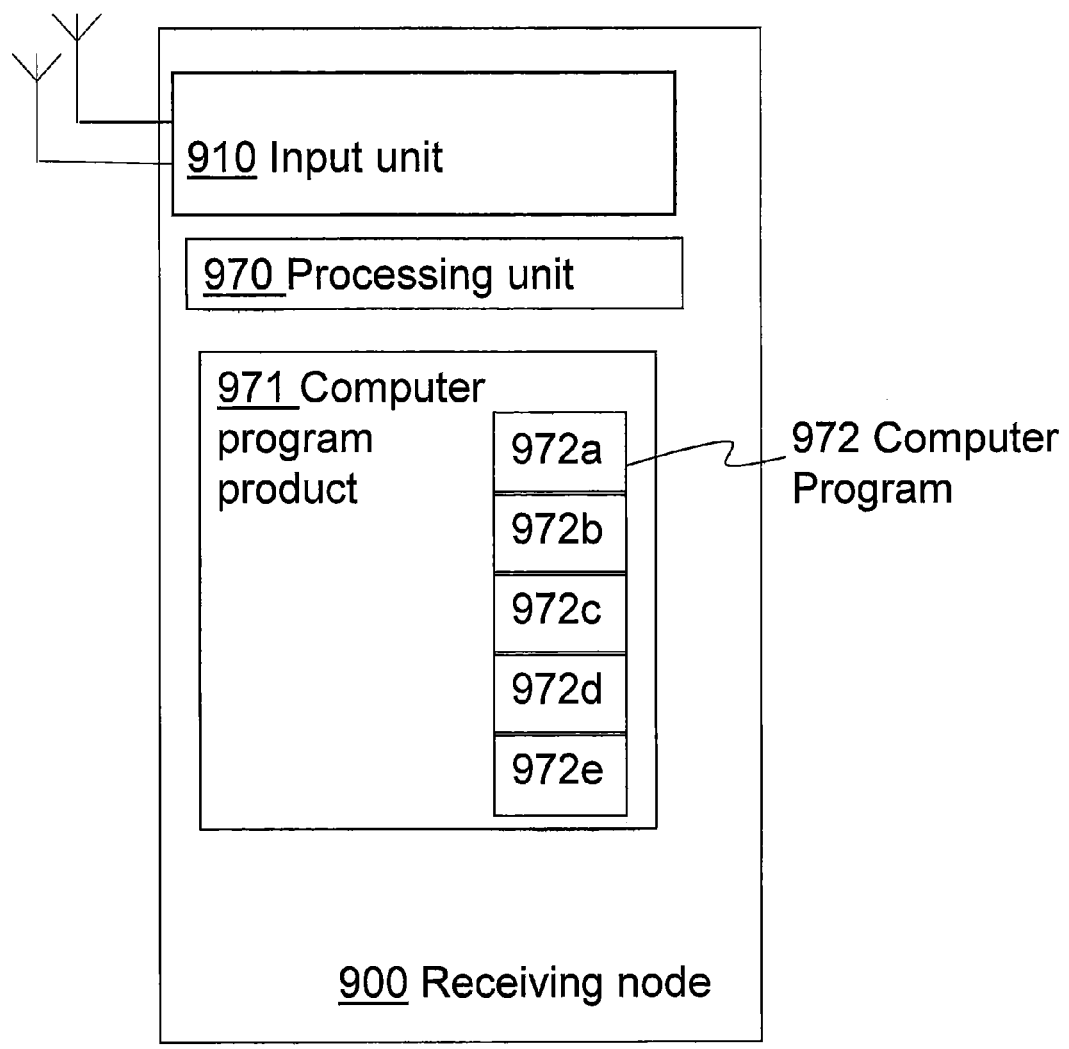
FIG. 9B illustrates schematically a receiving node according to some embodiments of the present disclosure.

FIG. 9B schematically illustrates an embodiment of the receiving node 900, which is an alternative way of disclosing the embodiment illustrated in FIG. 9A. The receiving node 900 comprises an input unit 910 which is adapted to receive a signal transmitted over a radio channel. The input unit 910 may be integrated in hardware of the receiving node 900. The receiving node 900 also comprises a processing unit 970 which may be a single unit or a plurality of units. Furthermore, the receiving node 900 comprises at least one computer program product 971 with a computer readable medium in the form of a non-volatile memory, e.g. an Electrically Erasable Programmable Read-Only Memory (EEPROM), a flash memory or a disk drive. The computer program product 971 also comprises a computer program 972 stored on the computer readable medium, which computer program 972 comprises computer readable code means which when run on the receiving node 900 causes the processing unit 970 in the receiving node 900 to perform the steps of the procedures described earlier in conjunction with FIGS. 8A, 8B and 8C.

Hence in the embodiments described, the code means in the computer program 972 of the receiving node 900 comprises a turbo equalizer module 972a adapted to decode the received radio signal $s_{in}$ into a decoded signal 445 and to selectively operate in a turbo equalization mode to compensate for Inter-Symbol Interference, "ISI", in the received radio signal $s_{in}$, an error level determining module 972b adapted to determine a current error level in the decoded signal 445, a turbo equalization gain predictor module 972c adapted to predict a turbo equalization gain based on instantaneous channel information, an analyzer and decider module 972d adapted to decide whether to apply the turbo equalization mode depending on the predicted turbo equalization gain and the determined current error level in the decoded signal 445, and a channel estimator module 972e adapted to provide the instantaneous channel information. The code means may thus be implemented as computer program code structured in computer program modules. The modules 972a-e essentially perform the steps of the flow in FIG. 8A to emulate the receiving node described in FIG. 9A. In other words, when the different modules 972a-972e are run on the processing unit 970, they correspond to the circuits 920-940 in FIG. 9A.

Although the code means in the embodiment disclosed above in conjunction with FIG. 9B are implemented as computer program modules which when run on the receiving node 900 causes the node to perform steps described above in conjunction with FIG. 8A, one or more of the code means may in alternative embodiments be implemented completely or partly in firmware, hardware or combinations thereof.

The above mentioned and described embodiments are only given as examples and should not be limiting to the present disclosure. It will be understood by those skilled in the art that various modifications, combinations and changes may be made to the embodiments without departing from the scope of the present disclosure. In particular, different part solutions in the different embodiments can be combined in other configurations, where technically possible. The scope of the present disclosure is, however, defined by the appended claims.

ABBREVIATIONS

BER Bit Error Rate
CR Coding Rate
CRC Cyclic Redundancy Check
DFE Decision Feedback Equalizer
DSP Digital Signal Processor
EVA Extended Vehicular A LLR Log Likelihood Ratio
LTE Long Term Evolution
MMSE Minimum Mean Square Error
ISI Inter Symbol Interference
QAM Quadrature Amplitude Modulation
RB Resource Block
RBS Radio Base Station
RMS Root Mean Square
SIMO Single Input Multiple Output
SINR Signal to Interference and Noise Ratio
UL Uplink

The invention claimed is:

1. A method in a receiving node for determining when to apply a turbo equalization mode to compensate for Inter-Symbol Interference, "ISI", in a radio signal received over a radio channel from a transmitting node, comprising:
   decoding the received radio signal (sin) into a decoded signal;
   determining a current error level in the decoded signal;
   predicting a turbo equalization gain based on instantaneous channel information of the radio channel; and
   deciding whether to apply the turbo equalization mode depending on the predicted turbo equalization gain and the determined current error level in the decoded signal.

2. The method according to claim 1, wherein said deciding whether to apply the turbo equalization mode is performed by checking if a decision measure formed from the predicted turbo equalization gain and the determined current error level fulfils a condition that is required to motivate use of the turbo equalization mode.

3. The method according to claim 2, wherein the decision measure is formed to reflect a probability of error-free decoding of said received radio signal and wherein the condition is fulfilled when the decision measure is at or above a threshold level.

4. The method according to claim 3, wherein the threshold level depends on modulation and coding rate of the received radio signal, but is independent of Signal-to-Interference-and-Noise Ratio, "SINR", and bandwidth of the received radio signal.

5. The method according to claim 3, wherein the threshold level depends on a maximum number of iterations applied for the turbo equalization mode.

6. The method according to claim 3, wherein the turbo equalization mode is switched on when said decision measure is above said threshold level and switched off when said decision measure is below said threshold level.

7. The method according to claim 1, wherein said deciding whether to apply the turbo equalization mode further depends on a channel delay spread of the received radio signal.

8. The method according to claim 1, wherein the turbo equalization gain is predicted as a difference between a first quality measure formed from the instantaneous channel information with feedback of soft information and a second quality measure formed from the instantaneous channel information without feedback of soft information.

9. The method according to claim 8, wherein the first quality measure is determined by assuming that the soft information indicates error-free decoding of the received radio signal.

10. The method according to claim 8, wherein the first and second quality measures are based on Signal-to-Interference-and-Noise Ratio, "SINR", of the received radio signal.

11. The method according to claim 8, wherein the second quality measure reflects Signal-to-Interference-and-Noise Ratio, "SINR", of the received radio signal after equalization if the received radio signal is decoded without using feedback of soft information and the first quality measure reflects predicted SINR of the received radio signal after equalization if error-free decoding of the received radio signal using feedback of soft information is obtained.

12. The method according to claim 8, wherein the decoded signal comprises decoded bits and the soft information comprises improved soft values of coded bits.

13. The method according to claim 12, wherein said determining the current error level comprises determining an error measure from the improved soft values of the coded bits.

14. The method according to claim 13, wherein the error measure is determined as an expectation value over the coded bits of a function that relates magnitudes of the improved soft values of the coded bits to bit error rate, "BER", levels.

15. The method according to claim 13, wherein said determining the current error level further comprises performing a cyclic redundancy check, "CRC", of the decoded bits and determining said error measure from the improved soft values of the coded bits when the CRC check indicates bit errors in the decoded bits.

16. The method according to claim 1, wherein the received radio signal comprises turbo encoded symbols and wherein said decoding of the received radio signal comprises:
   Fourier transformation of the turbo encoded symbols into the frequency domain,
   equalization of the transformed turbo encoded symbols in the frequency domain,
   inverse Fourier transformation of the equalized transformed turbo encoded symbols into equalized symbols in the time domain,
   soft de-mapping of the equalized symbols into soft values of coded bits, and
   turbo decoding the soft values of the coded bits into the decoded signal and soft information.

17. The method according to claim 16, wherein when said turbo equalization mode is applied, said decoding of the received radio signal further comprises:
   interleaving the soft information,
   mapping the soft information to soft symbols,
   transforming the soft symbols into the frequency domain and
   feeding back the transformed soft symbols into the equalization.

18. The method according to claim 17, wherein the equalization is performed by filtering the transformed turbo encoded symbols through a feed-forward filter and filtering the transformed soft symbols through a feed-backward filter and combining the filtered transformed turbo encoded symbols with the filtered transformed soft symbols.

19. The method according to claim 18, wherein filter coefficients for the feed-forward filter and for the feed-backward filter are calculated from channel estimates of the received radio signal and from average power of the soft symbols.

20. A computer program product comprising a nontransitory computer readable medium storing a computer program, that when executed by a processor, allows the processor to perform the method according to claim 1.

21. The method according to claim 1, further comprising:
   switching the turbo equalization mode between on and off based on the decision of whether to apply the turbo equalization mode.

22. A receiving node configured to receive a radio signal over a radio channel from a transmitting node, the receiving node comprising:
   a turbo equalizer configured to decode the received radio signal into a decoded signal and to selectively operate in a turbo equalization mode to compensate for Inter-Symbol Interference, "ISI", in the received radio signal;

an equalization mode selector operatively connected to said turbo equalizer and configured to determine a current error level in the decoded signal and to predict a turbo equalization gain based on instantaneous channel information, the equalization mode selector further configured to decide whether to apply the turbo equalization mode depending on the predicted turbo equalization gain and the determined current error level in the decoded signal; and a channel estimator operatively connected to said turbo equalizer and to said equalization mode selector and configured to provide said instantaneous channel information.

23. The receiving node of claim 22, wherein the equalization mode selector further comprises:

an error level determining circuit configured to determine the current error level in the decoded signal by determining an error measure from improved soft values of coded bits;

a turbo equalization gain predictor configured to predict the turbo equalization gain as a difference between a first quality measure and a second quality measure, wherein the first quality measure is formed from the instantaneous channel information with feedback of the improved soft values of the coded bits and the second quality measure is formed from the instantaneous channel information without feedback of the improved soft values of the coded bits; and an analyzer and decider configured to decide whether to apply the turbo equalization mode by comparing a decision measure formed from the predicted turbo equalization gain and the determined current error level in the decoded signal to a threshold level, wherein the decision measure reflects a probability of error-free decoding of said received radio signal.

* * * * *